US 7,465,985 B2

(12) United States Patent
Choi et al.

(10) Patent No.: US 7,465,985 B2
(45) Date of Patent: Dec. 16, 2008

(54) NON-VOLATILE MEMORY DEVICE AND METHODS OF FORMING THE SAME

(75) Inventors: Byung-Yong Choi, Suwon-si (KR); Choong-Ho Lee, Seongnam-si (KR); Dong-Gun Park, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 42 days.

(21) Appl. No.: 11/580,086

(22) Filed: Oct. 13, 2006

(65) Prior Publication Data
US 2007/0090449 A1   Apr. 26, 2007

(30) Foreign Application Priority Data
Oct. 14, 2005   (KR) .................. 10-2005-0097031

(51) Int. Cl.
H01L 21/334 (2006.01)

(52) U.S. Cl. .................. 257/324; 257/314; 257/315; 257/330; 257/347; 257/E29.129; 257/E21.179; 257/E21.422; 257/E21.68

(58) Field of Classification Search .................. 257/314, 257/315, 324, 330, 347, E29.129, E21.179
See application file for complete search history.

(56) References Cited

U.S. PATENT DOCUMENTS

| 6,242,783 | B1 | 6/2001 | Ohmi et al. |
| 6,716,686 | B1 | 4/2004 | Buynoski et al. |
| 6,995,414 | B2 * | 2/2006 | Yaegashi ............... 257/296 |
| 7,067,872 | B2 * | 6/2006 | Ichige et al. ........... 257/315 |
| 2002/0047157 | A1 * | 4/2002 | Hidaka et al. .......... 257/347 |
| 2004/0084715 | A1 * | 5/2004 | Takeuchi et al. ........ 257/315 |

FOREIGN PATENT DOCUMENTS

KR   100161737 B1   8/1998

* cited by examiner

Primary Examiner—Cuong Q Nguyen
Assistant Examiner—Tran Q Tran
(74) Attorney, Agent, or Firm—Harness Dickey & Pierce

(57) ABSTRACT

A non-volatile memory device and a method of forming the same are provided. The non-volatile memory device may include a cell isolation pattern and a semiconductor pattern sequentially stacked on a predetermined or given region of a semiconductor substrate, a cell gate line on the semiconductor pattern and on a top surface of the semiconductor substrate on one side of the cell isolation pattern, a multi-layered trap insulation layer between the cell gate line and the semiconductor substrate, and the cell gate line and the semiconductor pattern, a first impurity diffusion layer in the semiconductor substrate on both sides of the cell gate line and a second impurity diffusion layer in the semiconductor pattern on both sides of the cell gate line.

15 Claims, 31 Drawing Sheets

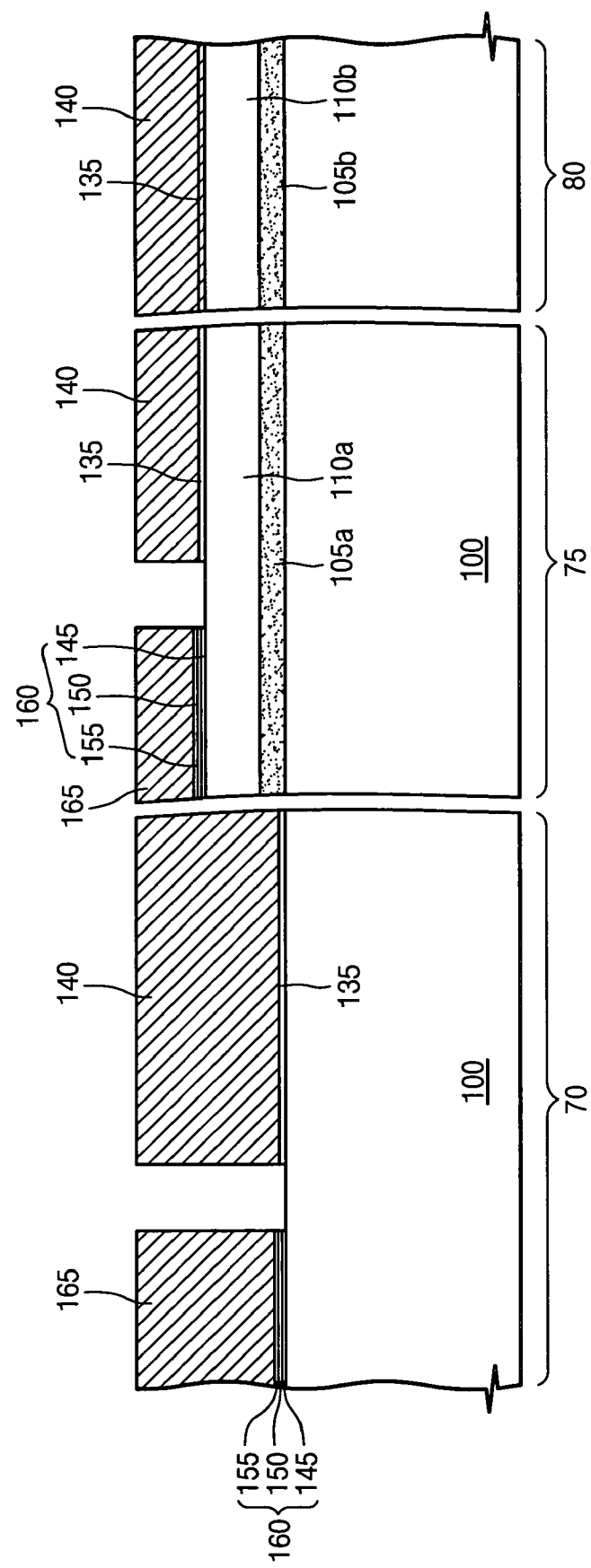

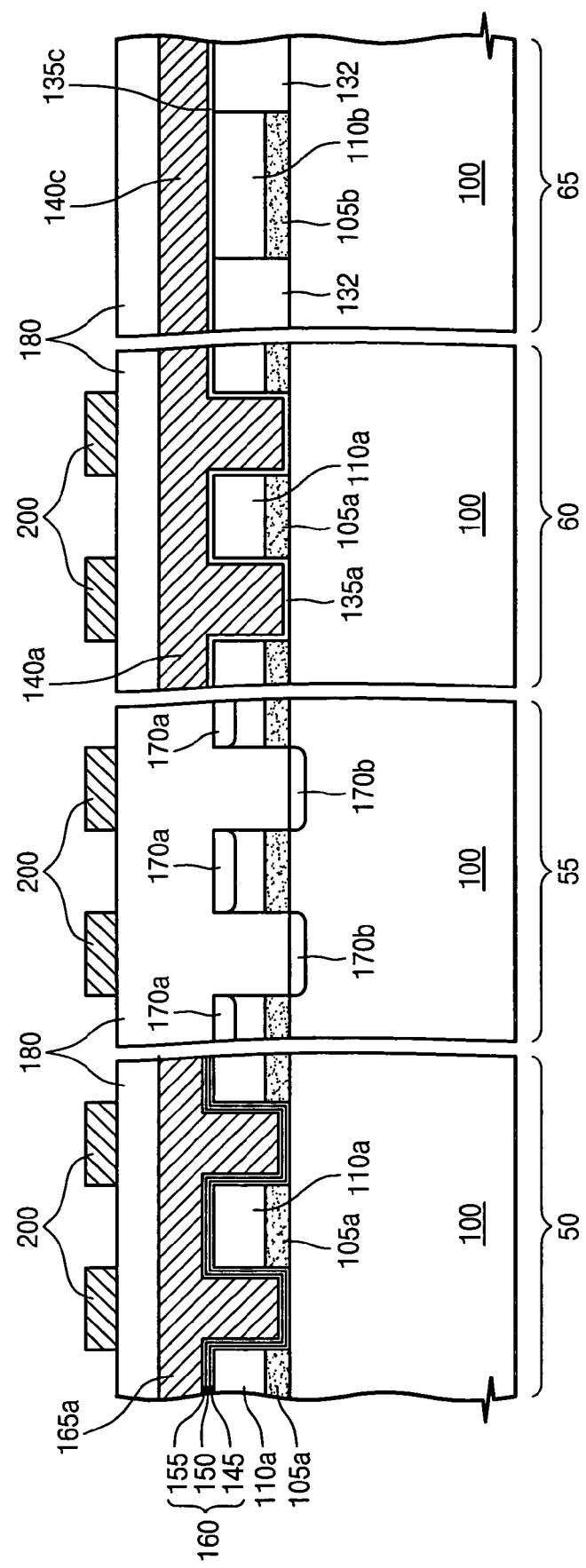

NON-VOLATILE MEMORY DEVICE AND METHODS OF FORMING THE SAME

PRIORITY STATEMENT

This application claims priority under 35 U.S.C. §119(a) to Korean Patent Application No. 10-2005-0097031, filed on Oct. 14, 2005, in the Korean Intellectual Property Office (KIPO), the entire contents of which are incorporated herein by reference.

BACKGROUND

1. Field

Example embodiments relate to a semiconductor device and a method of forming the same. Other example embodiments relate to a non-volatile memory device and a method of forming the same.

2. Description of the Related Art

A non-volatile memory device may retain stored data when the power is cut off. The non-volatile memory device may be divided into a floating gate type non-volatile memory device and a floating trap type non-volatile memory device. The floating gate type non-volatile memory device may store electrical charges in a free charge form in a floating gate. Unlike the floating gate type non-volatile memory device, the floating trap type non-volatile memory device may store electrical charges in respectively separated traps of a deep level. The floating gate type non-volatile memory device may require a tunnel oxide layer that is relatively thicker than that of the floating trap type non-volatile memory. The floating gate type non-volatile memory device may require a relatively high operating voltage because of the relatively thick tunnel oxide layer. The floating gate type non-volatile memory device may have various limitations to being highly integrated.

A floating trap type non-volatile memory device may be a silicon oxide nitric oxide (SONOS) memory device. The SONOS memory device may store electrical charges in traps, and thus, may have a thinner tunnel oxide layer compared to the floating gate type non-volatile memory device. Because the SONOS memory device requires a relatively low operating voltage, a higher integration may be achieved. Research on the floating trap type non-volatile memory has been under development.

SUMMARY

Example embodiments relate to a semiconductor device and a method of forming the same. Other example embodiments relate to a non-volatile memory device and a method of forming the same.

According to example embodiments, a non-volatile memory device may include a cell isolation pattern and a semiconductor pattern on a predetermined or given region of a semiconductor substrate, a cell gate line on the semiconductor pattern and on a top surface of the semiconductor substrate on one side of the cell isolation pattern, a multi-layered trap insulation layer between the cell gate line and the semiconductor substrate, and the cell gate line and the semiconductor pattern, a first impurity diffusion layer in the semiconductor substrate on both sides of the cell gate line and a second impurity diffusion layer in the semiconductor pattern on both sides of the cell gate line.

According to example embodiments, a method of forming a non-volatile memory device may include forming a cell isolation pattern and a semiconductor pattern stacked sequentially on a predetermined or given region of a semiconductor substrate, forming a multi-layered trap insulation layer on the semiconductor pattern and on the semiconductor substrate on one side of the cell isolation pattern, forming a cell gate line on the multi-layered trap insulation layer above the semiconductor pattern and the semiconductor substrate in the one side of the cell isolation pattern, forming a first impurity diffusion layer in the semiconductor substrate on both sides of the cell gate line and forming a second impurity diffusion layer in the semiconductor pattern on both sides of the cell gate line.

BRIEF DESCRIPTION OF THE DRAWINGS

Example embodiments will be more clearly understood from the following detailed description taken in conjunction with the accompanying drawings. FIGS. 1-28 represent non-limiting, example embodiments as described herein.

FIG. 1 is a diagram illustrating a non-volatile memory device according to example embodiments;

FIG. 2 is a diagram of lines I-I', II-II', III-III' and IV-IV' of FIG. 1 to illustrate a non-volatile memory device according to example embodiments;

FIG. 3 is a diagram of lines V-V', VI-VI' and VII-VII' of FIG. 1 to illustrate a non-volatile memory device according to example embodiments;

FIG. 4 is a diagram of lines IV-IV' and VII-VII' of FIG. 1 to illustrate a modified non-volatile memory device according to example embodiments;

FIGS. 5 to 9 and 10A to 12A are diagrams of lines I-I', II-II', III-III' and IV-IV' of FIG. 1 to illustrate a method of forming a non-volatile memory device according to example embodiments;

FIGS. 10B to 12B are diagrams of lines V-V', VI-VI' and VII-VII' of FIG. 1 to illustrate a method of forming a gate and thereafter according to example embodiments;

FIGS. 13 and 14 are diagrams of lines I-I', II-II', III-III' and IV-IV' of FIG. 1 to illustrate a method of forming a modified non-volatile memory device according to example embodiments;

FIGS. 15 to 18 are diagrams of lines I-I', II-II', III-III' and IV-IV' of FIG. 1 to illustrate another method of forming active regions and a cell isolation pattern according to example embodiments;

FIG. 19 is a diagram of lines I-I', II-II', III-III' and IV-IV' of FIG. 1 to illustrate a non-volatile memory device according to other example embodiments;

FIG. 20 is a diagram of lines V-V', VI-VI' and VII-VII' of FIG. 1 to illustrate a non-volatile memory device according to other example embodiments;

FIG. 21 is a diagram of lines IV-IV' and VII-VII' of FIG. 1 to illustrate a modified non-volatile memory device according to other example embodiments;

FIGS. 22 to 25 are diagrams of lines I-I', II-II', III-III' and IV-IV' of FIG. 1 to illustrate a method of forming a non-volatile memory device according to other example embodiments;

FIG. 26 is a diagram of lines I-I', II-II', III-III' and IV-IV' of FIG. 1 to illustrate a method of forming a modified non-volatile memory device according to other example embodiments; and FIGS. 27 and 28 are diagrams of lines I-I', II-II', III-III' and IV-IV' of FIG. 1 to illustrate another method of forming active regions and a cell isolation pattern according to other example embodiments.

DETAILED DESCRIPTION OF EXAMPLE EMBODIMENTS

Figure 1:
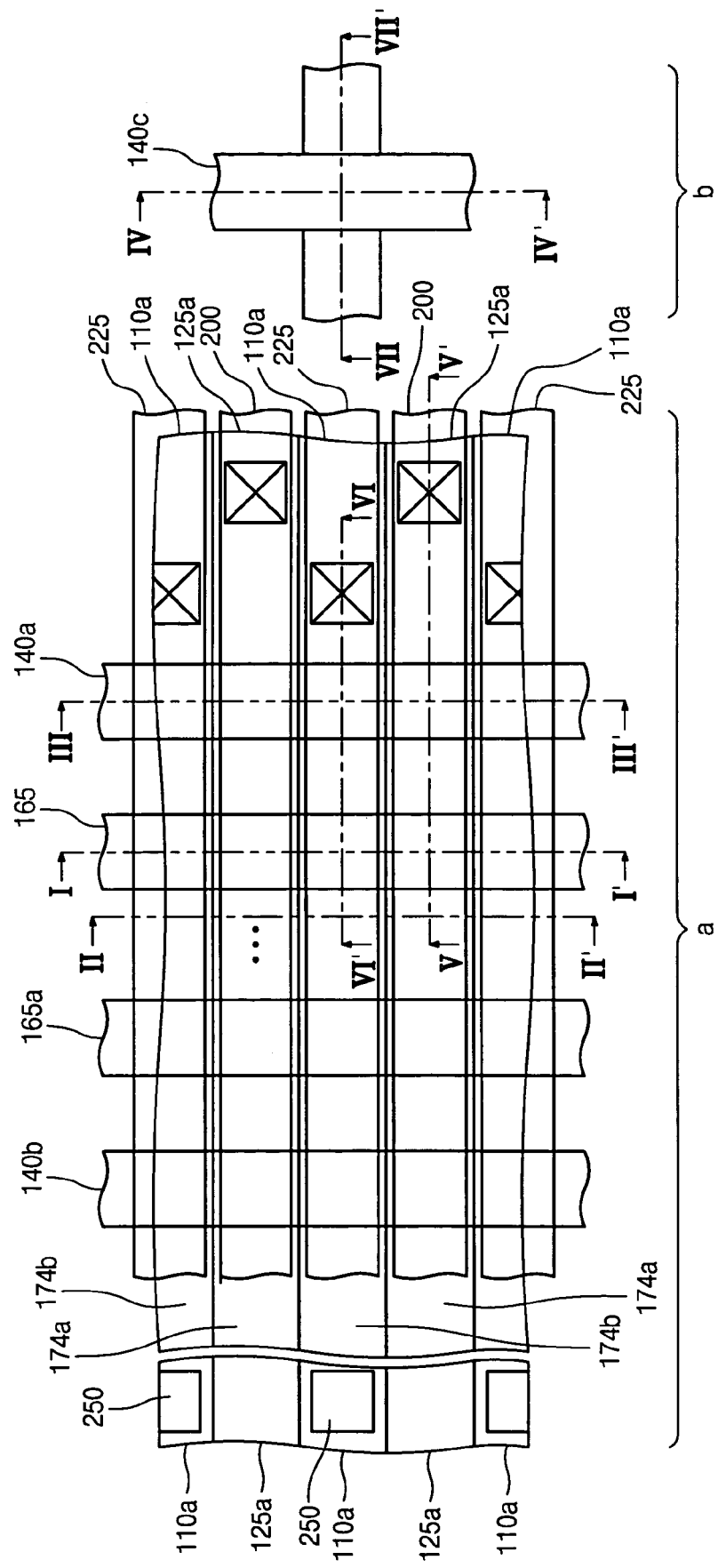

Various example embodiments are described more fully hereinafter with reference to the accompanying drawings, in which example embodiments are shown. Example embodiments may, however, be embodied in many different forms and should not be construed as limited to the example embodiments set forth herein. Rather, these example embodiments are provided so that this disclosure will be thorough and complete and will fully convey the scope of example embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. A first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relation to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
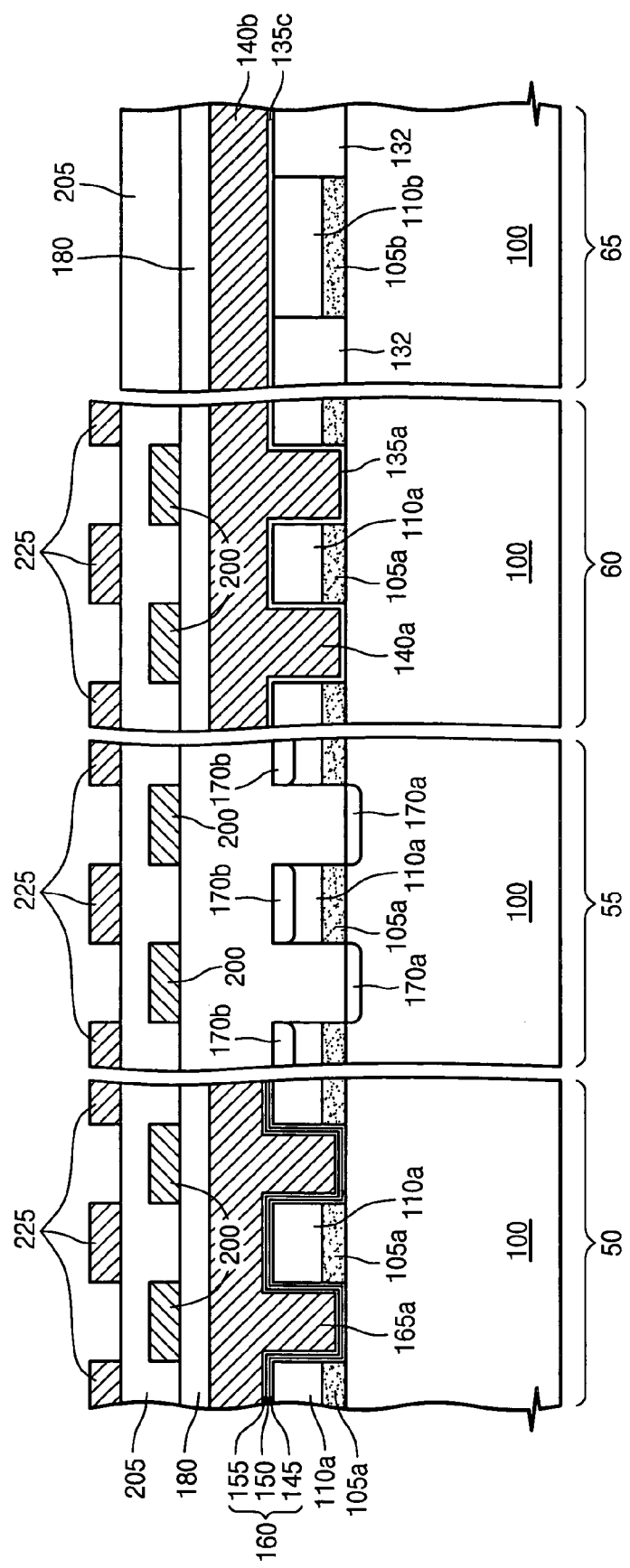
Figure 3:
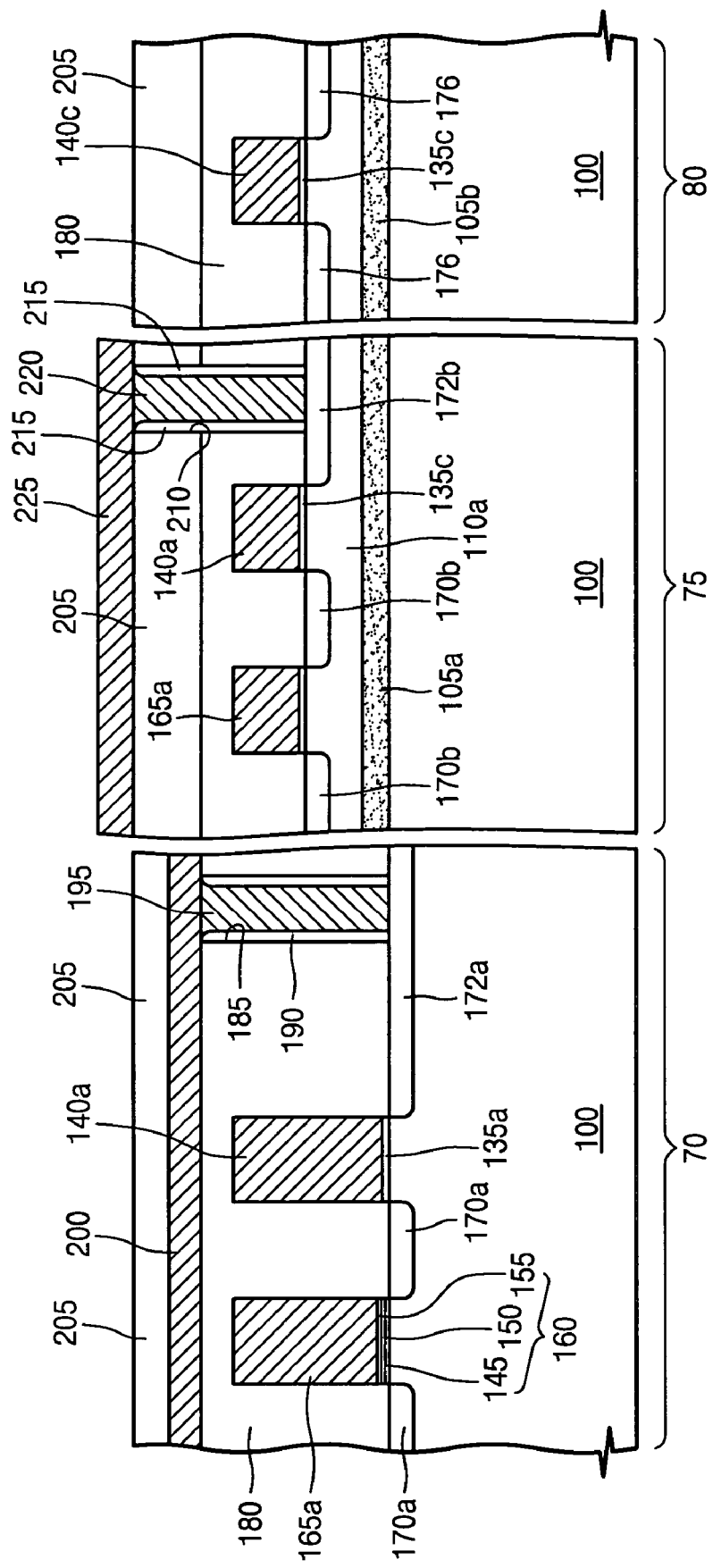

FIG. 1 is a diagram illustrating a non-volatile memory device according to example embodiments. FIG. 2 is a diagram of lines I-I', II-II', III-III' and IV-IV' of FIG. 1 to illustrate a non-volatile memory device according to example embodiments. FIG. 3 is a diagram of lines V-V', VI-VI' and VII-VII' of FIG. 1 to illustrate a non-volatile memory device according to example embodiments. In FIG. 2, reference numerals 50, 55, 60, and 65 represent lines I-I', II-II', III-III' and IV-IV' of FIG. 1. In FIG. 3, reference numerals 70, 75, and 80 represent lines V-V', VI-VI' and VII-VII' of FIG. 1.

Referring to FIGS. 1 to 3, a semiconductor substrate 100 may include a cell string region a and a peripheral region b. A plurality of cell isolation patterns 105a may be disposed on the semiconductor substrate 100 of the cell string region a. The cell isolation pattern 105a may be in line form. The cell isolation patterns 105a may be parallel and spaced apart from each other and may be formed of an insulation material, for example, an oxide.

The cell isolation patterns 105a may define first active regions 125a. The first active region 125a may be a portion of the semiconductor substrate 100. The first active region 125a may include the semiconductor substrate 100 of one side of the cell isolation patterns 105a. The first active region 125a may include the semiconductor substrate 100 that is not covered by the cell isolation patterns 105a. The first active regions 125a may be line-shaped, parallel and spaced apart from each other. A semiconductor pattern 110a may be disposed on the cell isolation pattern 105a. The semiconductor pattern 110a may be line-shaped. The semiconductor pattern 110a may include a sidewall aligned on a sidewall of the cell isolation pattern 105a. The semiconductor pattern 110a may correspond to a second active region. Hereinafter, a reference numeral 110a may represent the semiconductor pattern and/or the second active region.

The cell isolation pattern 105a may electrically isolate the first active region 125a therebeside from the second active region 110a thereabove. There may be no horizontal spacing between the first active region 125a and the second active region 110a by the cell isolation pattern 105a. The non-volatile memory device may be more highly integrated without reducing the minimum line width that is defined by a photolithography process. The area of a cell array may be reduced by up to one half.

The semiconductor pattern 110a may be made of a semiconductor type identical to that of the semiconductor substrate 100. For example, the semiconductor pattern 110a and the semiconductor substrate 100 may be formed of silicon. The semiconductor pattern 110a and the semiconductor substrate 100 may be formed of germanium and/or silicon germanium. The semiconductor pattern 110a and the semiconductor substrate 100 may be formed of a single crystal semiconductor. The semiconductor pattern 110a and the semiconductor substrate 100 may be doped with a first conductive type impurity. A string select gate line 140a and a ground select gate line 140b may be parallel to and above first and second active regions 125a and 110a. The string and ground select gate lines 140a and 140b may be spaced apart from each other. A plurality of cell gate lines 165a may be disposed between the string select gate line 140a and the ground select gate line 140b. The plurality of cell gate lines 165a may be spaced apart from each other and may be parallel to and above first and second active regions 125a and 110a.

The cell gate line 165a may be above the first active region 125a and a top surface of the semiconductor pattern 110a. The cell gate line 165a may be formed on the sidewalls of the cell isolation pattern 105a and the sidewalls of the semiconductor pattern 110a. The select gate lines 140a and 140b may be on the first active region 125a and the top surface of the semiconductor pattern 110a, and the select gate lines 140a and 140b may be on the sidewalls of the cell isolation pattern 105a and the sidewalls of the semiconductor pattern 110a.

The cell gate line 165a may be formed of a conductive material. For example, the cell gate line 165a may be formed of a single layer and/or a composite layer selected from the group including doped polysilicon, metal (e.g., tungsten, molybdenum and/or any other suitable metal), conductive metal nitride (e.g., titanium nitride, tantalum nitride and/or any other conductive metal nitride) and/or metal silicide (e.g., tungsten silicide, cobalt silicide and/or any other metal silicide). The string and ground select gate lines 140a and 140b may be formed of a conductive material. For example, the select gate lines 140a and 140b may be formed of a single layer and/or a composite layer selected from the group including doped polysilicon, metal (e.g., tungsten, molybdenum and/or any other suitable metal), conductive metal nitride (e.g., titanium nitride, tantalum nitride and/or any other suitable conductive metal nitride) and/or metal silicide (e.g., tungsten silicide, cobalt silicide and/or any other suitable metal silicide). The cell gate line 165a and the select gate lines 140a and 140b may be formed of identical conductive material. The cell gate line 165a and the select gate lines 140a and 140b may also be formed of respectively different conductive materials.

A string select gate insulation layer 135a may be inserted between the string select gate line 140a and the semiconductor pattern 110a, and between the string select gate line 140a and the first active region 125a. A ground select gate insulation layer (not shown) may be inserted between the ground select gate line 140b and the semiconductor pattern 110a, and between the ground select gate line 140b and the first active region 125a. The string select gate insulation layer 135a and the ground select gate insulation layer may be formed of an identical insulation layer (e.g., silicon oxide).

A multi-layered trap insulation layer 160 may be inserted between the cell gate line 165a and the semiconductor pattern 110a, and between the cell gate line 165a and the first active region 125a. The multi-layered trap insulation layer 160 may be inserted between the cell gate line 165a and the sidewalls of the semiconductor pattern 110a and cell isolation pattern 105a. The multi-layered trap insulation layer 160 may include a tunnel insulation layer 145, a trap storage layer 150, and a blocking insulation layer 155, which are sequentially stacked.

The tunnel insulation layer 145 may be formed of silicon oxide. The trap storage layer 150 may include traps storing electrical charges. For example, the trap storage layer 150 may be formed of silicon nitride and/or silicon oxide nitride. The trap storage layer 150 may be formed of an insulation layer having a plurality of nano crystals. The nano crystal may be formed of a semiconductor material (e.g., silicon, germanium, germanium silicon and/or any other suitable semiconductor material) and/or metal. The nano crystal may form one trap. The blocking insulation layer 155 may serve to prevent or reduce electrical charges stored in the trap storage layer 150 from being exhausted to the cell gate line 165a. The blocking insulation layer 155 may be formed of an insulation layer (e.g., a silicon oxide layer) having a dielectric constant identical to that of the tunnel insulation layer 145. The blocking insulation layer 155 may be thicker than the tunnel insulation layer 145. The blocking insulation layer 155 may include an insulation material having a dielectric constant higher than that of the tunnel insulation layer 145. For example, the blocking insulation layer 155 may be formed of a single layer and/or a composite layer selected from insulating metal oxide layers (e.g., a hafnium oxide layer, an aluminum oxide layer and/or any other suitable metal oxide layer).

A first impurity diffusion layer 170a may be formed at the first active region 125a of both sides of the cell gate line 165a, and a second impurity diffusion layer 170b may be formed at the second active region 110a of both sides of the cell gate line 165a. The first and second impurity diffusion layers 170a and 170b may be doped with the second conductive-type impurity. The first conductive impurity may be different from the second conductive impurity, for example, the first conductive-type impurity may be a p-type impurity and the second conductive-type impurity may be an n-type impurity and/or the first conductive-type impurity may be an n-type impurity and the second conductive-type impurity may be a p-type impurity.

A first non-volatile memory cell may include the multi-layered trap insulation layer 160 and the cell gate line 165a on the first active region 125a, and the first impurity diffusion layer 170a on both sides of the cell gate line 165a. A second non-volatile memory cell may include the multi-layered trap insulation layer 160 and the cell gate line 165a on the second active region 110a, and the second impurity diffusion layer 170b on both sides of the cell gate line 165a. The first non-volatile memory cell may be disposed beside the cell isolation pattern 105a, and the second non-volatile memory cell may be disposed on the cell isolation pattern 105a. The cell isolation pattern 105a may electrically isolate the first non-volatile memory cell from the second non-volatile memory cell.

The string select gate line 140a on the first active region 125a may correspond to a gate electrode of a string select transistor in a first form (hereinafter, referred to as a first string select transistor), and the string select gate line 140a on the second active region 110a may correspond to a gate electrode of a string select transistor in a second form (hereinafter, referred to as a second string select transistor). The ground select gate line 140b on the first active region 125a may correspond to a gate electrode of a ground select transistor in a first form (hereinafter, referred to as a first ground select transistor), and the ground select gate line 140b on the second active region 110a may correspond to a gate electrode of a ground select transistor in a second form (hereinafter, referred to as a second ground select transistor).

A first common drain region 172a may be formed at the first active region 125a on one side of the string select gate line 140a, and a second common drain region 172a may be formed at the second active region 110a on one side of the string select gate line 140a. The common drain regions 172a and 172b may be doped with a second conductive-type impurity. The first impurity diffusion layer 170a between the string select gate line 140a and the cell gate line 165a adjacent thereto may correspond to a source/drain region of the first non-volatile memory cell, and also may correspond to a source region of the first string select transistor. The first common drain region 172a may correspond to a drain region of the first string select transistor. The second impurity diffusion layer 170b between the string select gate line 140a and the cell gate line 165a adjacent thereto may correspond to a source/drain region of the second non-volatile memory cell, and also may correspond to a source region of the second string select transistor. The second common drain region 172b may correspond to a drain region of the second string select transistor.

First common source region 174a may be formed at the first active region 125a of one side of the ground select gate line 140b, and second common source region 174b may be formed at the second active region 110a of one side of the ground select gate line 140b. The common source regions 174a and 174b may be doped with impurities of a second conductive-type. The first impurity diffusion layer 170a between the ground select gate line 140b and the cell gate line 165a adjacent thereto may correspond to a source/drain region of the first non-volatile memory cell, and also may correspond to a drain region of the first ground select transistor. The first common source region 174a may correspond to a source region of the first ground select transistor. The second impurity diffusion layer 170b between the ground select gate line 140b and the cell gate line 165a adjacent thereto may correspond to a source/drain region of the second non-volatile memory cell, and also may correspond to a drain region of the second ground select transistor. The second common source region 174b may correspond to a drain region of the second ground select transistor.

A bottom surface of the second impurity diffusion layer 170b may be spaced apart from a top surface of the cell isolation pattern 105a. Body regions of the second non-volatile memory cells in one cell string (e.g., one semiconductor pattern 110a) may be electrically connected to each other. The body region may correspond to the semiconductor pattern 110a below a channel region of the second non-volatile memory cell. A body contact 250 may be connected to one end of the semiconductor pattern 110a. The body contact 250 may be connected to the top surface of the one end in the semiconductor pattern 110a. The body contact 250 may be electrically connected to the body regions of the second non-volatile memory cells via the semiconductor pattern 110a between the second impurity diffusion layer 170b and the cell isolation patterns 105a. A predetermined or given operating voltage may be applied to the body region of the second non-volatile memory cell through the body contact 250. The body contact 250 may be in a contact plug form. A body interconnection may be connected on the body contact 250. In contrast, the body contact 250 may be line-shaped. The body contact 250 may intersect a plurality of the semiconductor patterns 110a arranged in parallel, and may be simultaneously connected to one ends of the semiconductor patterns 110a.

Body regions of the first non-volatile memory cells may be connected to each other through the semiconductor substrate 100. Well voltage supply means may be disposed on the semiconductor substrate for applying a predetermined or given operating voltage to the body regions of the first non-volatile memory cells. When the body contact 250 is line-shaped, the body contact 250 may be further connected to one ends of the first active regions 125a. The body contact 250 may simultaneously supply a predetermined or given operating voltage to the body regions of the first and second non-volatile memory cells. On the other hand, when the body contact 250 is in a contact plug form, second body contacts may be disposed on the semiconductor substrate 100 to be connected to one ends of the first active region 125a, respectively.

Referring to FIGS. 1 to 3, the peripheral region b may be a region where a peripheral circuit including a peripheral transistor may be disposed. A buried insulation pattern 105b and a peripheral active semiconductor pattern 110b may be sequentially stacked on the semiconductor substrate 100 of the peripheral region b. A peripheral device isolation layer 132 may surround the sidewalls of the buried insulation pattern 105b and the peripheral active semiconductor pattern 110b. The peripheral active semiconductor pattern 110b may correspond to a peripheral active region. The top surface of the peripheral active region may have a height identical to that of the semiconductor pattern 110a. The buried insulation pattern 105b may be formed of material identical to that of the cell isolation pattern 105a.

A peripheral gate electrode 140c may be formed on the peripheral active region, and a peripheral gate insulation layer 135c may be inserted between the peripheral gate electrode 140c and the peripheral active region. The peripheral gate electrode 140c may be formed of a conductive material identical to that of the select gate lines 140a and 140b. In contrast, the peripheral gate electrode 140c may be formed of a conductive material different from that of the select gate lines 140a and 140b. The peripheral gate insulation layer 135c may be formed of silicon oxide. A peripheral impurity diffusion layer 176 may be disposed at the peripheral active region of both sides of a peripheral gate electrode 140c. The peripheral impurity diffusion layer 176 may be spaced apart from the buried insulation pattern 105b. The peripheral impurity diffusion layer 176 may be contacted with the buried insulation pattern 105b. The peripheral gate electrode 140c, the peripheral gate insulation layer 135c, and the peripheral impurity diffusion layer 176 may constitute a peripheral transistor.

The buried insulation pattern 105b may be omitted. The peripheral active semiconductor pattern 110b may extend below to contact the semiconductor substrate 100. The extended peripheral semiconductor pattern 110b may correspond to a protruding part upwardly extended from the top surface of the semiconductor substrate 100. The protruding part and the semiconductor substrate 100 may not include a boundary surface. The top surface of the protruding part may have the height identical to that of the top surface of the semiconductor pattern 110a. A first interlayer insulation layer 180 may cover an entire surface of the semiconductor substrate 100. A first contact hole 185 may be formed through the first interlayer insulation layer 180 to expose the first common drain region 170a. A first insulation spacer 190 may be disposed on an inner sidewall of the first contact hole 185. The first contact hole 185 between the first insulation spacers 190 may be filled with a first contact plug 195.

A first bit line 200 may be disposed on the first interlayer insulation layer 180 above the cell gate lines 165a and the select gate lines 140a and 140b. The first bit line 200 may contact the first contact plug 195 to be electrically connected to the first common drain region 172a. In another case, the first contact plug 195 may be omitted, and a portion of the first bit line 200 may be extended down to fill the first contact hole 185. The first bit line 200 may be electrically connected to the first common drain region 172a through the first contact hole 185. The first bit line 200 may be formed in the first active region 125a. A plurality of first bit lines 200 may be disposed parallel to the first interlayer insulation layer 180. The interval between adjacent first bit lines 200 may be identical to the distance between both sides of the semiconductor pattern 110a.

The first interlayer insulation layer 180 may include a bottom insulation layer and a top insulation layer, which are sequentially stacked. A hole may be formed through the bottom insulation layer to expose the common source regions 174a and 174b arranged in one direction. A source line may be disposed in the hole. The source line may be connected to a plurality of common source regions 174a and 174b arranged in the one direction. The source line may be spaced laterally from the ground select gate line 140b. The body contact 250 may be formed through the bottom insulation layer to be connected to one end of the semiconductor pattern 110a.

When the body contact is in a line form, the body contact 250 may be spaced laterally from the source line, and then parallel to the source line.

When the body contact 250 is in a contact plug form, the body contact 250 may be formed through the bottom insulation layer to be connected to one end of the semiconductor pattern 110a. A body interconnection connected to the body contact 250 may be disposed on the bottom insulation layer and the top insulation layer may cover the body interconnection. The body interconnection may be separated from the first bit line 200 by the top insulation layer. In contrast, the body contact 250 may be formed through the first interlayer insulation layer 180 to be connected to the one end of the semiconductor pattern 110a, and the body interconnection may be disposed on the first interlayer insulation layer 180. The body interconnection may be laterally separated from the first bit line 200.

Referring to FIGS. 1 to 3, a second interlayer insulation layer 205 may cover an entire surface of the semiconductor substrate 200. A second contact hole 210 may be formed through the second and first interlayer insulation layers 205 to expose the second common drain region 172b. A second insulation spacer 215 may be disposed on an inner sidewall of the second contact hole 210. A second contact plug 220 may fill the second contact hole 210 between the second insulation spacers 215. A second bit line 225 may be disposed on the second interlayer insulation layer 205 above the cell gate line 165a and the select gate lines 140a and 140b. The second bit line 225 may contact the second contact plug 220 to be electrically connected to the second common drain region 172b. The second contact plug 220 may be omitted, and the second bit line 225 may be extended down to fill the second contact hole 210 to be connected to the second common drain region 172b. The second bit line 225 may be formed over the top of the semiconductor pattern 110a. A plurality of second bit lines 225 may be arranged parallel to the second interlayer insulation layer 205. The interval between the second bit lines 225 may be identical to the line width of the first active region 125a.

The first contact holes 185 may be arranged in a row direction parallel to the string select gate line 140a. The second contact holes 210 may be arranged in a row direction parallel to the string select gate line 140a. The first contact holes 185 and the second contact holes 210 may be arranged in different row directions. The first and second contact holes 185 and 210 may be arranged in a zigzag form. Although the diameters of the first and second contact holes 185 and 210 are the minimum line width, the interference between the first and second contact holes 185 and 210 may be prevented or reduced. The alignment margin between the first contact hole 185 and the first active region 125a may be obtained by the first insulation spacer 190. The alignment margin between the second contact hole 210 and the second active region 110a may be obtained by the second insulation spacer 215.

According to the non-volatile memory device, the first non-volatile memory cell may be disposed at the first active region 125a beside the cell isolation pattern 105a, and the second non-volatile memory cell may be disposed at the second active region 110a on the cell isolation pattern 105a. The cell isolation pattern 105a may electrically isolate the first and second non-volatile memory cells, and thus the interval between the first and second non-volatile memory cells may be zero. The plane area of the first and second non-volatile memory cells may be minimized or reduced, and then highly-integrated non-volatile memory devices may be achieved. The plane area of the first non-volatile memory cell may be $2F^2$. The first bit line 200 connected to the first non-volatile memory cell may be perpendicularly separated from the second bit line 225 connected to the second non-volatile memory cell. Although the interval between the first active region 125a and the second active region 110a may be zero, an interval between the first bit lines 200 and an interval between the second bit lines 225 may be obtained.

Figure 4:
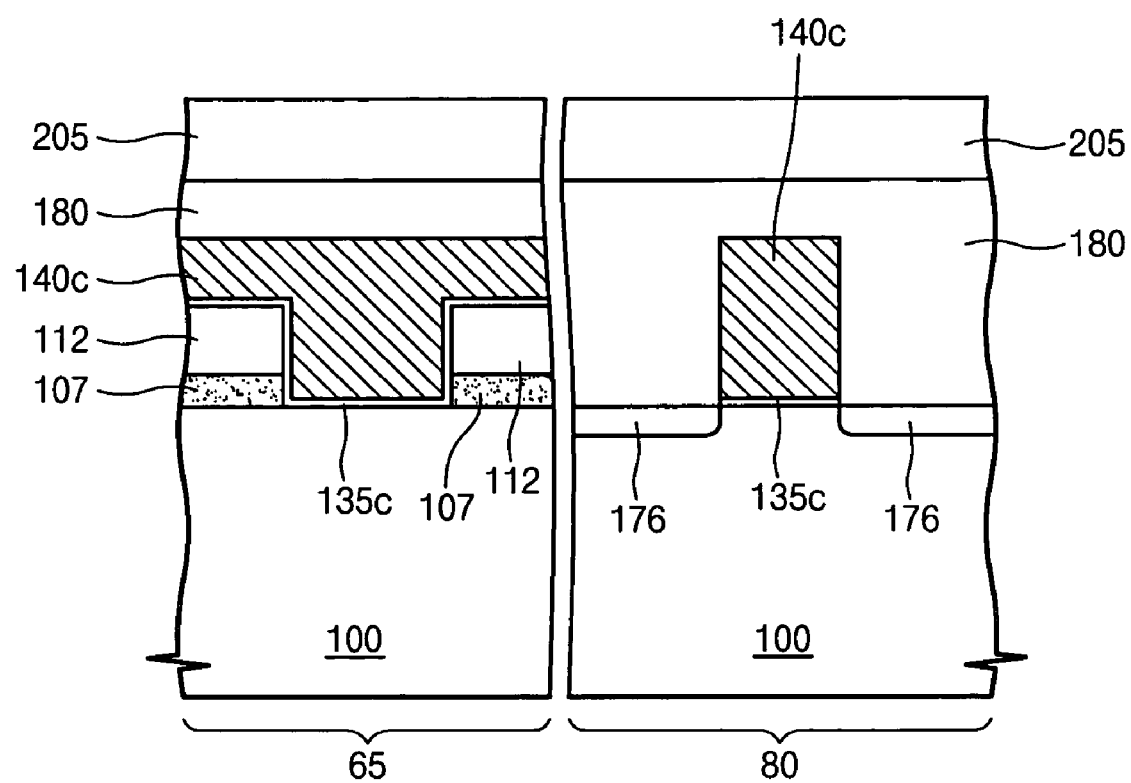

On the other hand, the peripheral transistor may be in a different form. This will be described with reference to FIG. 4. FIG. 4 is a diagram of lines IV-IV' and VII-VII' of FIG. 1 to illustrate a modified non-volatile memory device according to example embodiments. Referring to FIGS. 1 and 4, a peripheral isolation pattern 107 defining a peripheral active region may be disposed on the semiconductor substrate 100 of a peripheral region. The peripheral active region may include the semiconductor substrate 100 surrounded by the peripheral isolation pattern 107. The peripheral active region may include a portion of the semiconductor substrate 100. The top surface of the peripheral active region may have a height identical to that of the top surface of the first active region 125a of FIGS. 1 and 2. The peripheral isolation pattern 107 may be formed of material identical to that of the cell isolation pattern 105a. A peripheral semiconductor pattern 112 may be disposed on the peripheral isolation pattern 107. The peripheral semiconductor pattern 112 may be formed of a material identical to that of the semiconductor pattern 110a.

A peripheral gate electrode 140c may be formed in the peripheral active region (e.g., a portion of the semiconductor substrate 100). A peripheral gate insulation layer 135a' may be inserted between the peripheral active region and the peripheral gate electrode 140c. A peripheral impurity diffusion layer 176 may be disposed at the peripheral active region of both sides of the peripheral gate electrode 140c. The top surface of the peripheral impurity diffusion layer 176 may have a height identical to that of the top surface of the first impurity diffusion layer 170a of FIG. 3. Another peripheral transistor may be disposed at the peripheral semiconductor pattern 112. The peripheral isolation pattern 107 and the peripheral semiconductor pattern 112 may correspond to the buried insulation pattern 105b and the peripheral active semiconductor pattern 110b of FIGS. 2 and 3, respectively. A peripheral transistor disposed at the peripheral semiconductor pattern 112 may be separated from a peripheral transistor disposed at the peripheral active region by the peripheral isolation pattern 107.

FIGS. 5 to 9 and 10A to 12A are diagrams of lines I-I', II-II', III-III' and IV-IV' of FIG. 1 to illustrate a method of forming a non-volatile memory device according to example embodiments. FIGS. 10B to 12B are diagrams of lines V-V', VI-VI' and VII-VII' of FIG. 1 to illustrate a method of forming a gate and thereafter according to example embodiments.

Figure 5:
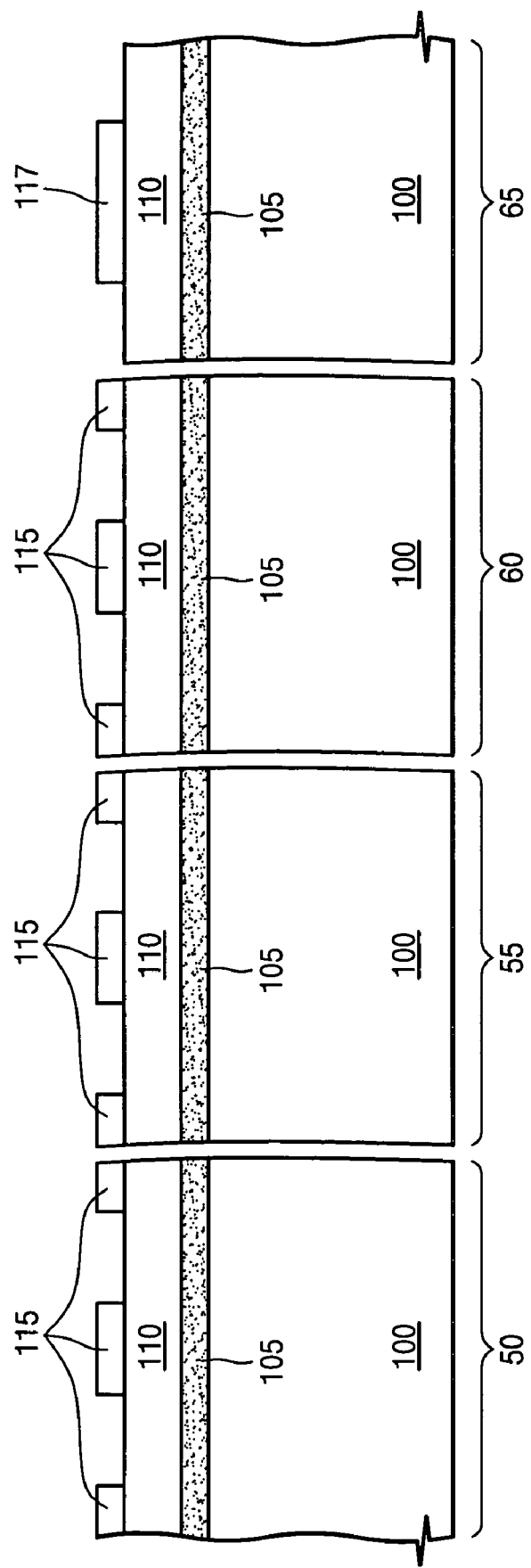

Referring to FIGS. 1 and 5, a buried insulation layer 105 and a semiconductor layer 110, which are sequentially stacked, may be formed on the semiconductor substrate 100. The semiconductor substrate 100 may include the cell string region a and the peripheral region b. The semiconductor layer 110 and the buried insulation layer 105 may be formed using a method of forming silicon on insulator (SOI) substrate. In one method, after the semiconductor substrate 100 having the buried insulation layer 105 thereon and a support substrate are bonded, most of the support substrate may be separated from the bonded structure. A portion of the support substrate may remain on the buried insulation layer 105. The remaining portion of the support substrate may correspond to the semiconductor layer 110. After separating the most support substrate, a planarization process may be performed on the surface of the semiconductor 110. The method of separating the support substrate may be a separating method using a porous layer and/or separating method using a micro bubble layer by a hydrogen element.

In another method, oxygen ions may be injected to a predetermined or given depth of a bulk semiconductor substrate to form the buried insulation layer 105. The bulk semiconductor substrate below the buried insulation layer 105 may correspond to the semiconductor substrate 100, and the bulk semiconductor substrate above the buried insulation layer 105 may correspond to the semiconductor layer 110. During the method of the injecting an oxygen ion, the buried insulation layer 105 and the semiconductor layer 110 may not be formed at the peripheral region b by using a mask that covers the peripheral region b. The top surface of the semiconductor substrate 100 in the peripheral region b may have a height higher than that of the top surface of the semiconductor substrate 100 in the cell string region. The top surface of the semiconductor substrate 100 in the peripheral region b may have a height identical to that of the top surface of the semiconductor layer 110 in the cell string region a.

Cell and peripheral hard mask patterns 115 and 117 may be formed on the semiconductor layer 110. The cell hard mask pattern 115 may be formed at the cell string region a, and the peripheral hard mask pattern 117 may be formed at the peripheral region b. A plurality of cell hard mask patterns 115 may be formed in parallel on the semiconductor layer 110 of the cell string region a. The cell hard mask patterns 115 may be formed in a line and spaced apart from each other. The hard mask patterns 115 and 117 may be formed of a material having an etching selectivity with respect to the semiconductor layer 110 and the buried insulation layer 105. For example, the hard mask patterns 115 and 117 may include a nitride layer. The hard mask patterns 115 and 117 may further include a buffer oxide layer (not shown) between the nitride layer and the semiconductor layer 110.

Figure 6:
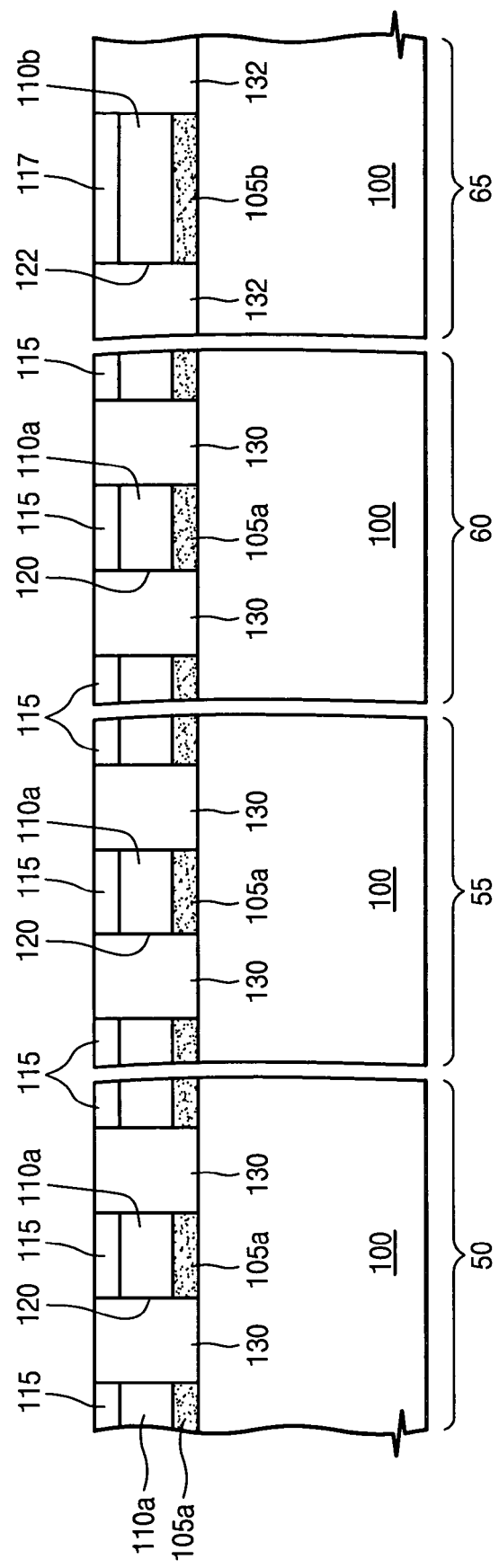

Referring to FIGS. 1 and 6, the semiconductor layer 110 and the buried insulation layer 105 may be continuously etched to expose the semiconductor substrate 100 using the hard mask patterns 115 and 117 as an etching mask. A cell isolation pattern 105a and a semiconductor pattern 110a, which are sequentially stacked, may be formed below the cell hard mask pattern 115 and a cell trench 120 may be formed between the semiconductor patterns 110a to expose the semiconductor substrate 100. A buried insulation pattern 105b and a peripheral active semiconductor pattern 110b, which are sequentially stacked, may be formed below the peripheral hard mask pattern 117 and a peripheral trench 122 may be formed to expose the semiconductor substrate of the peripheral region b.

The semiconductor substrate 100 exposed by the cell trench 120 may correspond to a first active region 125a. The first active region 125a may be disposed beside the cell isolation pattern 105a. The semiconductor pattern 110a may correspond to a second active region 110a. The first and second active regions 125a and 110a may be defined by the etching process. The peripheral active semiconductor pattern 110b may correspond to the peripheral active region. When the buried insulation layer 105 is not formed at the peripheral region b, a protruding part may be formed at the peripheral region b by the etching process using the hard mask patterns 115 and 117. The protruding part may be extended above the semiconductor substrate 100 of the peripheral region b. The protruding part may be connected to the semiconductor substrate 100 of the peripheral region b, and may correspond to the peripheral active region.

Referring to FIGS. 1 and 6, an insulation layer 130 may be formed on an entire surface of the semiconductor substrate 100 to fill the cell and peripheral trenches 120 and 122, and then the insulation layer 130 may be planarized until the hard mask patterns are exposed. The planarized insulation layer 130 filling the peripheral trench 122 may correspond to a peripheral device isolation layer 132. Before forming the insulation layer 130, a surface treatment process may be performed to cure the etching damages of the semiconductor substrate 100, which is exposed to the cell trench 120 and/or sidewalls of the semiconductor pattern 110. For example, the surface treatment process may include a thermal oxidation process and/or a wet process that removes an oxidation layer.

Figure 7:
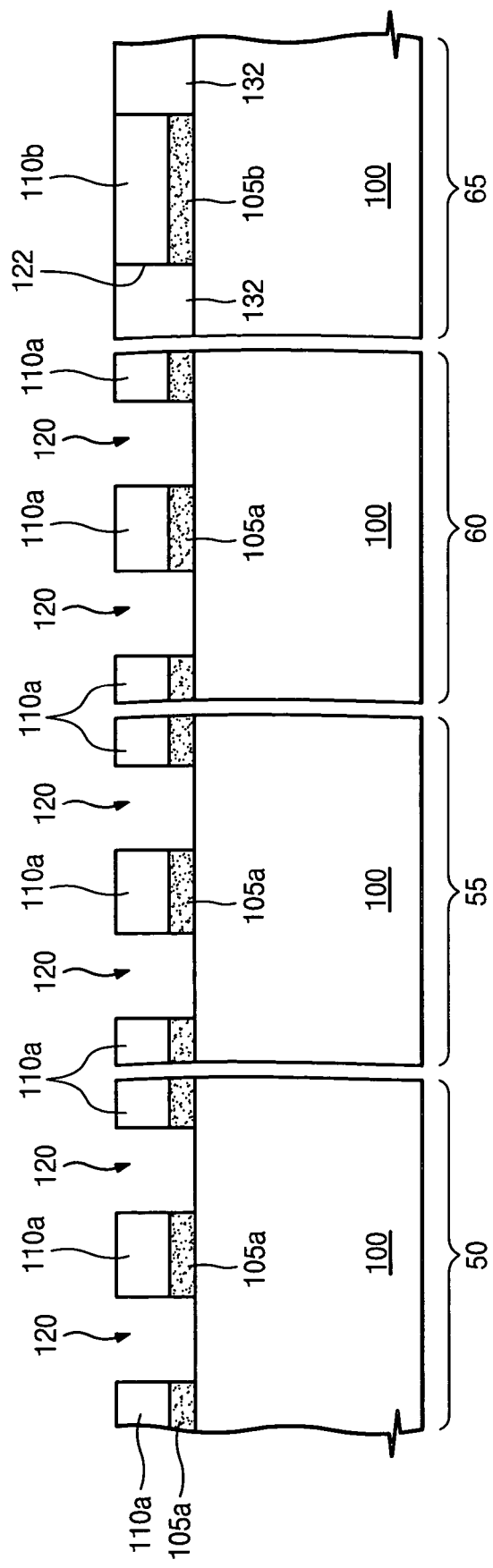

Referring to FIG. 7, the planarized insulation layer 130 of the cell trench 120 may be selectively removed to expose the bottom surface of the cell trench 120. The peripheral device isolation layer 132 may remain. The surface treatment process may further be performed after removing the planarized insulation layer 130 in the cell trench 120. The hard mask patterns 115 and 117 may be removed using a wet etching process to expose the top surfaces of the semiconductor pattern 110a and the peripheral active semiconductor pattern 110b.

On the other hand, the first and second active regions 125a and 110a, a cell isolation pattern 105a, a peripheral active semiconductor pattern 110b, and the peripheral device isolation layer 132 may be formed using another method. This method will be described with reference to FIGS. 15 to 18. FIGS. 15 to 18 are diagrams of lines I-I', II-II', III-III' and IV-IV' of FIG. 1 to illustrate another method of forming active regions and a cell isolation pattern according to example embodiments.

Figure 15:
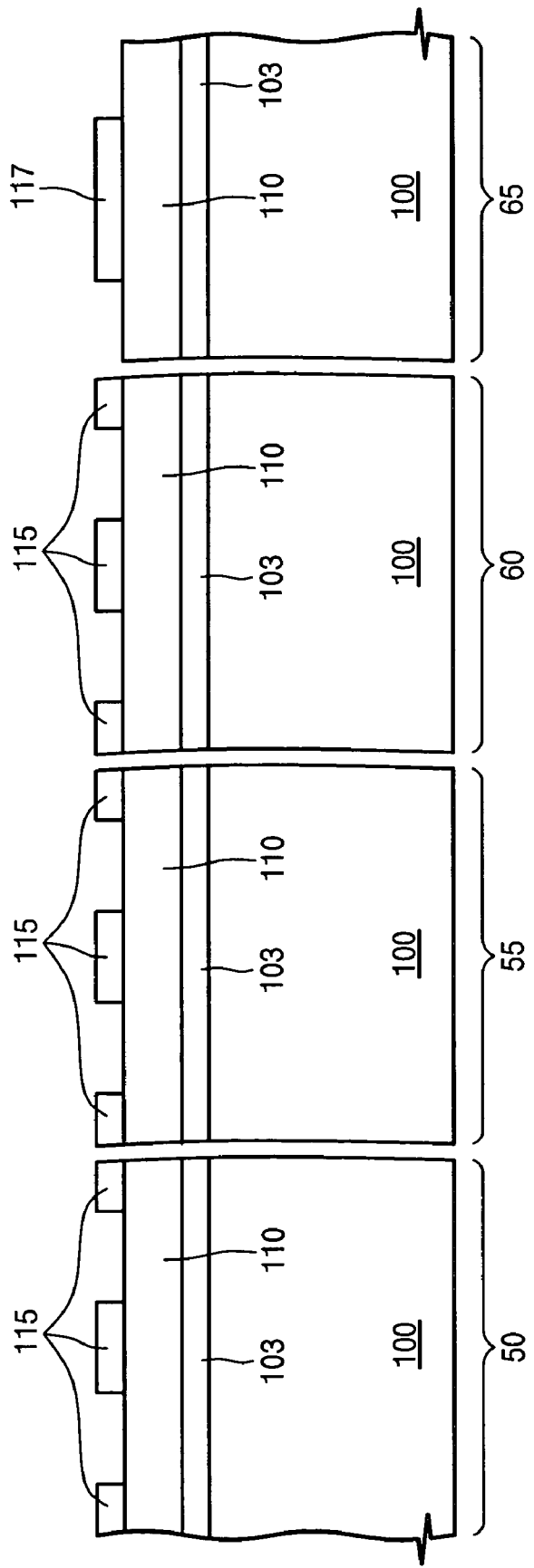

Referring to FIG. 15, a sacrificial layer 103 may be formed on the semiconductor substrate 100 using a first epitaxial process, and a semiconductor layer 110 may be formed on the sacrificial layer 103 using a second epitaxial process. The sacrificial layer 110 may be formed of a semiconductor having an etching selectivity with respect to the semiconductor substrate 100 and the semiconductor layer 110. For example, when the semiconductor substrate 100 and the semiconductor layer 110 are formed of silicon, the sacrificial layer 103 may be formed of silicon germanium. The cell and peripheral hard mask pattern 115 and 117 of FIG. 5 may be formed on the semiconductor layer 110.

Figure 16:
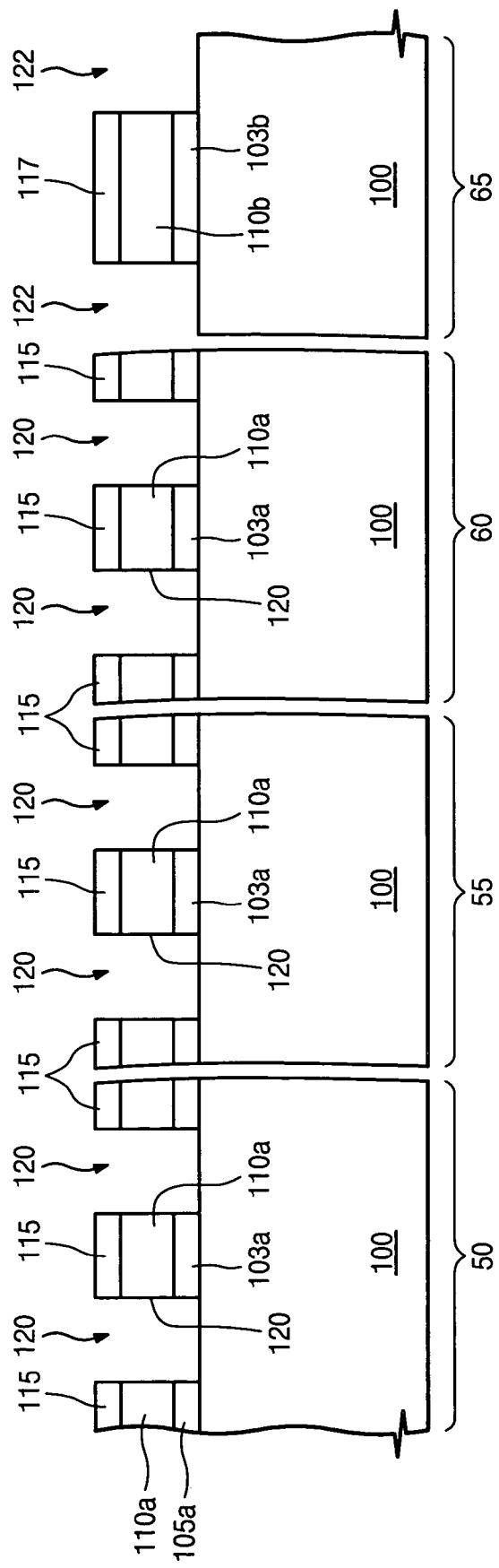

Referring to FIG. 16, the semiconductor layer 110 and the sacrificial layer 103 may be continuously patterned to form a cell trench 120 and a peripheral trench 122 using the hard mask patterns 115 and 117 as a etch mask, the cell trench 120 and the peripheral trench 122 exposing the semiconductor substrate 100. A cell sacrificial pattern 103a and a semiconductor pattern 110a, which are sequentially stacked, may be formed below the cell hard mask pattern 115, and also a peripheral sacrificial pattern 103a and a peripheral active semiconductor pattern 110b, which are sequentially stacked, may be formed below the peripheral hard mask pattern 117. The sidewalls of the cell and peripheral sacrificial patterns 103a and 103b may be exposed by the cell and peripheral trenches 120 and 122.

Figure 17:
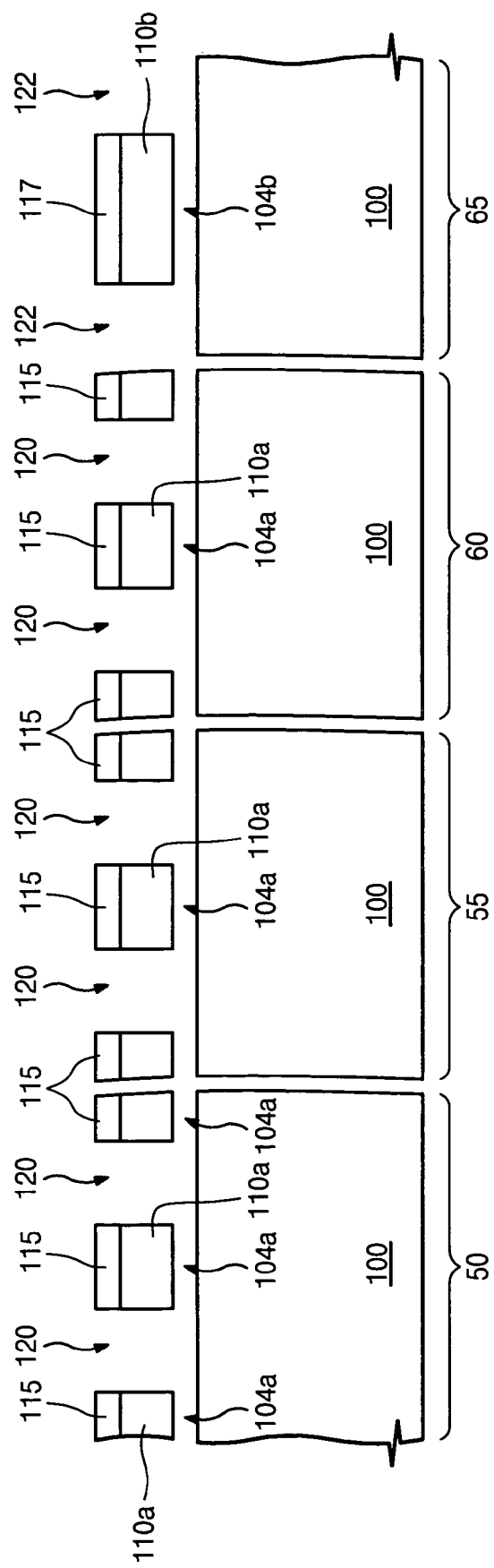

Referring to FIG. 17, the exposed sacrificial patterns 103a and 103b may be removed to form a first empty region 104a and a second empty region 104b. The first empty region 104a may be a region where the cell sacrificial pattern 103a is removed, and the second empty region 104b may be a region where the peripheral sacrificial pattern 103b is removed. Both ends of the semiconductor pattern 110a may be supported by the semiconductor layer 110 disposed in a core region around the cell string region. Both ends of the peripheral active semiconductor pattern 110b may be supported by the semiconductor layer 110 (not patterned) of the peripheral region b.

Figure 18:
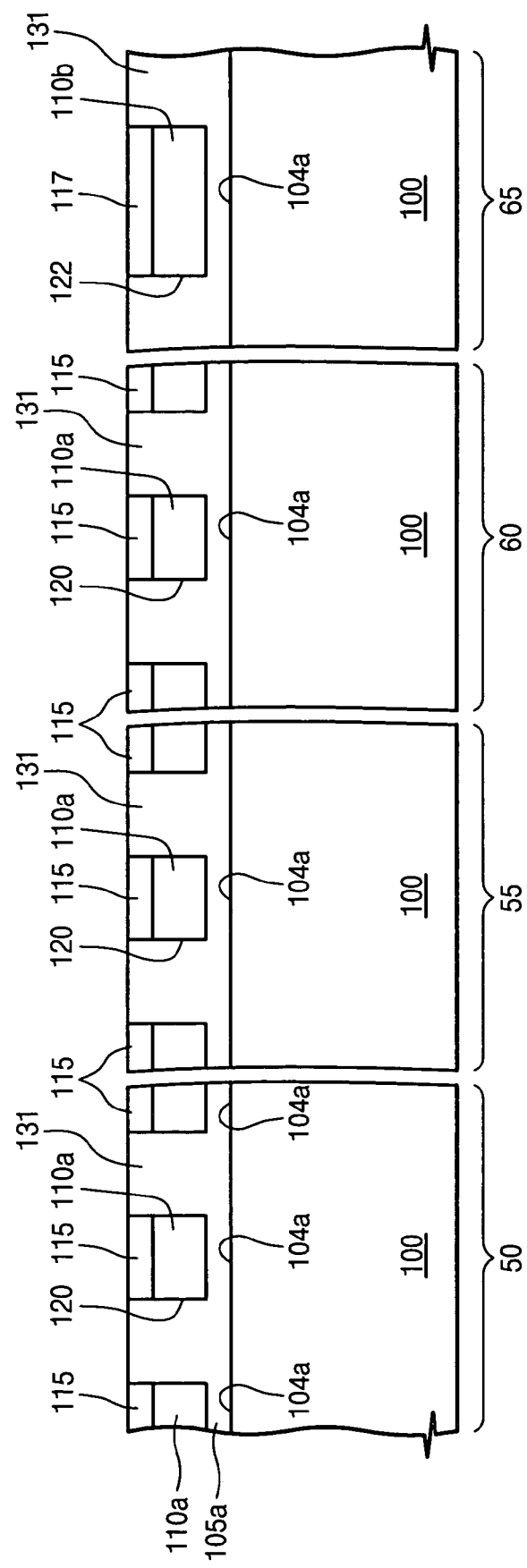

Referring to FIG. 18, an insulation layer 131 may be formed to fill the empty regions 104a and 104b and the trenches 120 and 122, and the insulation layer 131 may be planarized until the hard mask patterns 115 and 117 are exposed. The insulation layer 131 filling the first empty region 104a may correspond to the cell isolation pattern 105a of FIG. 7, and the insulation layer 131 filling the second empty region 104b may correspond to the buried insulation pattern 105b of FIG. 7. The insulation layer 131 filling the peripheral trench 122 may correspond to the peripheral device isolation layer 132 of FIG. 7. The insulation layer 131 filling the cell trench 120 may be removed to expose the semiconductor substrate 100. The surface treatment process may be performed on the exposed semiconductor substrate 100.

According to the first and second active regions 125a and 110a, and cell isolation pattern 105a are formed using the above method, the manufacturing cost may be decreased using a bulk substrate. The semiconductor pattern 110a and the peripheral active semiconductor pattern 110b may not be affected from an ion-injected damage. Productivity may be improved and deterioration of characteristics of the non-volatile memory cells may be reduced or prevented.

Figure 8:
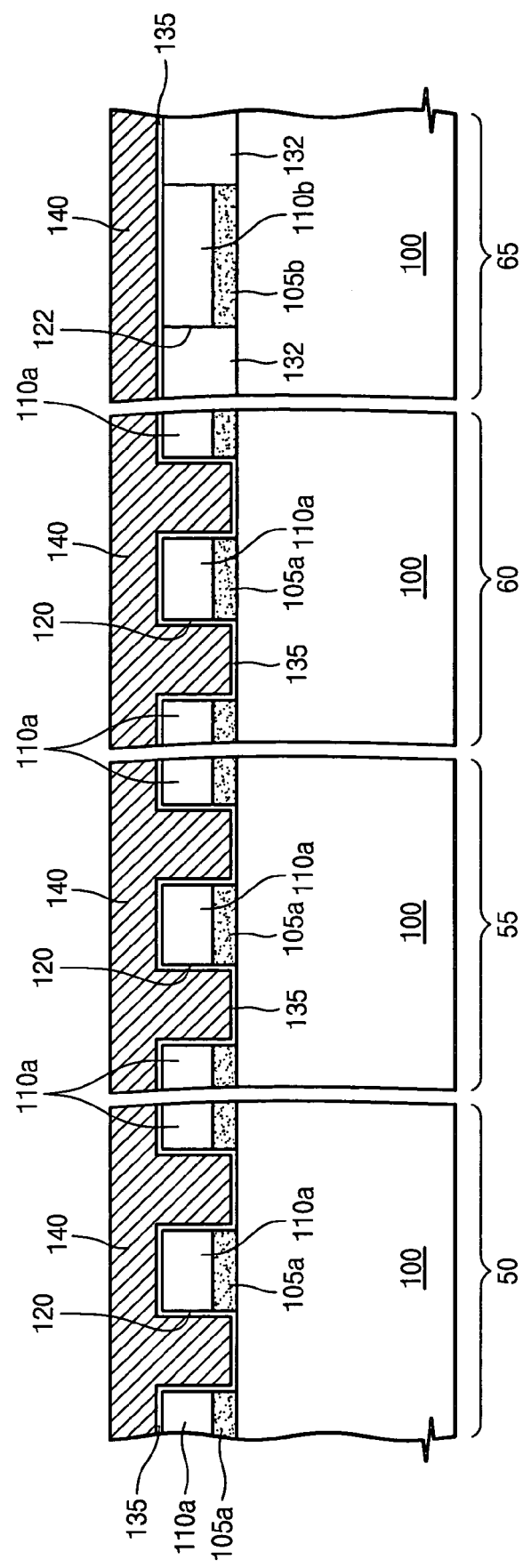

Referring to FIGS. 1 and 8, a gate insulation layer 135 and a first gate conductive layer 140 may be sequentially formed on the semiconductor substrate 100 including the exposed active regions 125a, 110a, and 110b. The gate insulation layer 135 may be formed of a thermal oxidation layer. Unlike the above, the gate insulation layer 135 may be formed using a thermal treatment process after forming a chemical vapor deposition (CVD) oxide layer. The first gate conductive layer 140 may fill the cell trenches 120. The first gate conductive layer 140 may be formed of a single layer and/or a composite layer selected from the group consisting of doped polysilicon, metal (e.g., tungsten, molybdenum and/or any other suitable metal), conductive metal nitride (e.g., titanium nitride, tantalum nitride and/or any other conductive metal nitride) and/or metal silicide (tungsten silicide, cobalt silicide and/or any other suitable metal silicide).

Figure 9:
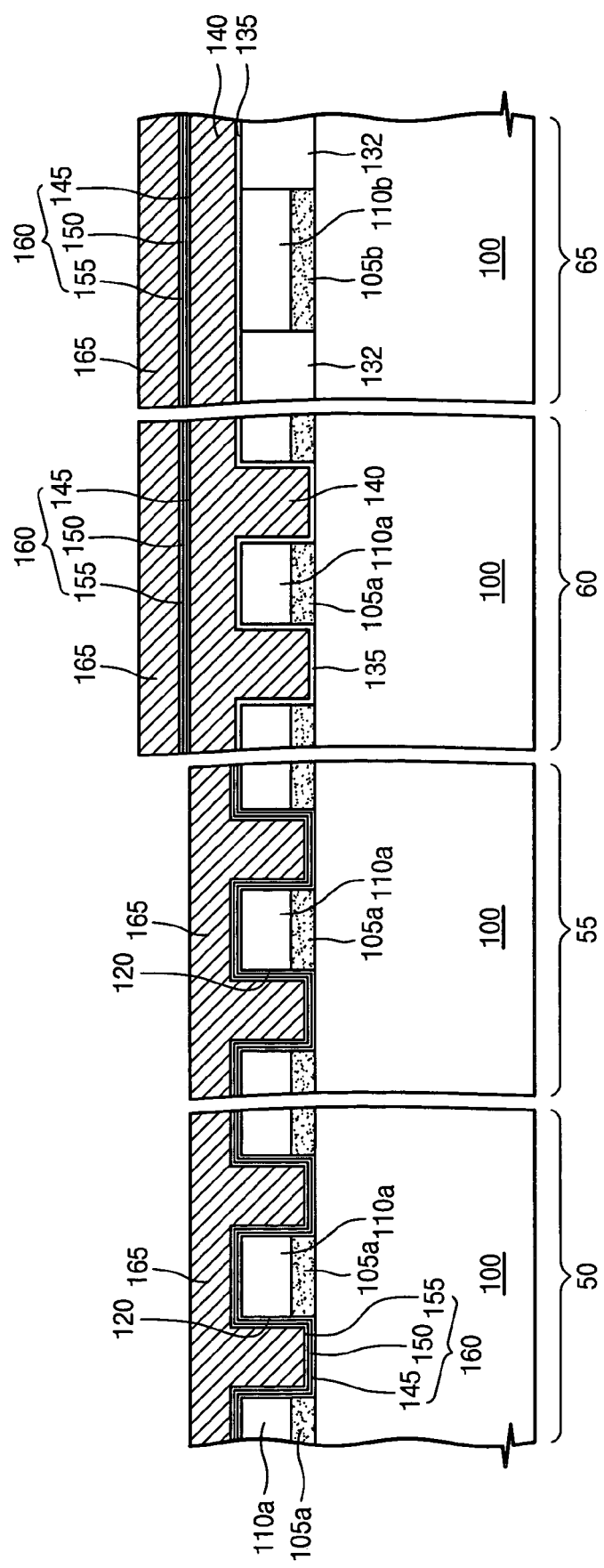

Referring to FIGS. 1 and 9, the first gate conductive layer 140 and the gate insulation layer 135 may be selectively removed to expose portions of the first and second active regions 125a and 110a. The exposed portions of the first and second active regions 125a and 110a may be a region where the non-volatile memory cells are formed. The first gate conductive layer 140 and the gate insulation layer 135 in the region where string and ground select transistors are formed, and also the first conductive layer 140 and the gate insulation layer 135 of the peripheral region b, may remain.

A multi-layered trap insulation layer 160 and a second gate conductive layer 165 may be sequentially formed on an entire surface of the semiconductor substrate 100. The multi-layered trap insulation layer 160 may include a tunnel insulation layer 145, a trap storage layer, and a blocking insulation layer 155, which are sequentially stacked. The multi-layered insulation layer 160 may be formed of a material that is in the above description referring to FIGS. 1 to 3. The second gate conductive layer 165 may fill the cell trenches 120 in the region where the non-volatile memory cells are formed. The second gate conductive layer 165 may be formed of a single layer and/or a composite layer selected from the group including doped polysilicon, metal (e.g., tungsten, molybdenum and/or any other suitable metal), conductive metal nitride (e.g., titanium nitride, tantalum nitride and/or any other conductive metal nitride) and/or metal silicide (e.g., tungsten silicide, cobalt silicide and/or any other suitable metal silicide). The first and second gate conductive layers 140 and 165 may be formed of an identical conductive material. In contrast, the first and second gate conductive layers 140 and 165 may be formed of respectively different conductive materials.

Figure 10A:
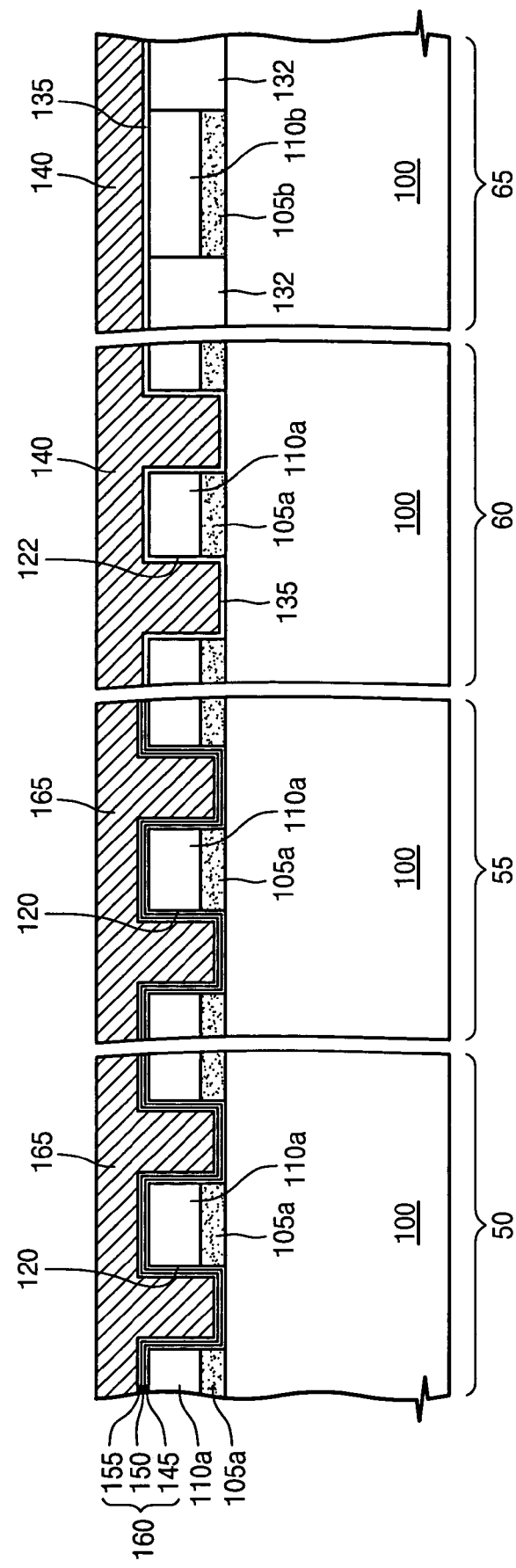

Referring to FIGS. 1, 10A, and 10B, the second gate conductive layer 165 and the multi-layered trap insulation layer 160, in the peripheral region b and the region where the string and ground select transistors are formed, may be removed to expose the first gate conductive layer 140. As illustrated in FIG. 10B, the first gate conductive layer 140 (in the region where the select transistors are formed) and the second gate conductive layer 165 (in the region where the non-volatile memory cell are formed) may be spaced apart from each other in the cell string region a. The interval between the first and second gate conductive layers 140 and 165 in the cell string region a may be larger and/or smaller than the minimum line width.

Figure 11B:
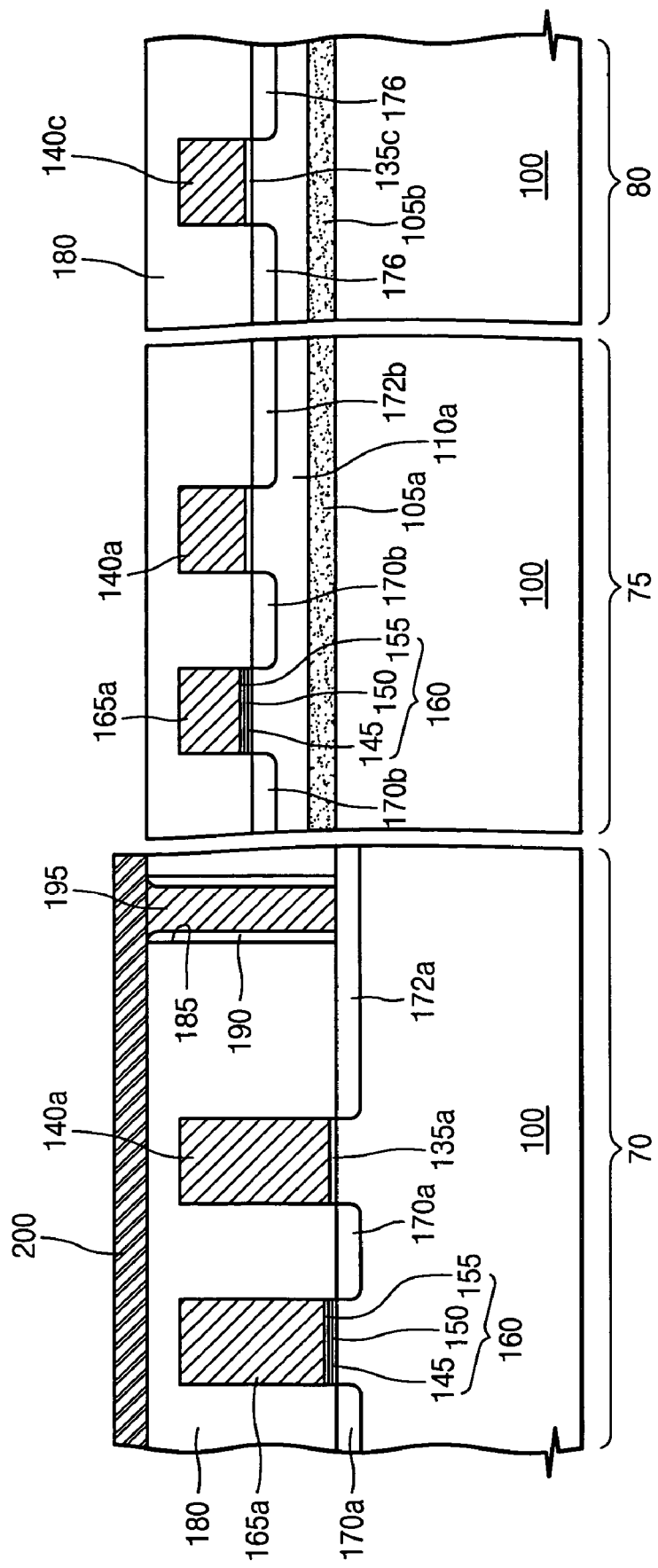

Referring to FIGS. 1, 11A, and 11B, the first gate conductive layer 140 may be patterned to form select gate lines 140a and 140b and a peripheral gate electrode 140c. The second gate conductive layer may be patterned to form the cell gate lines 165a. The select gate lines 140a and 140b, the peripheral gate electrode 140c, and the cell gate lines 165a may be simultaneously formed and/or be sequentially formed. The gate insulation layer 135, inserted between the string select gate line 140a and the first and second active regions 125a and 110a, may be defined as a string select gate insulation layer 135a. The gate insulation layer 135, inserted the ground select gate line 140b and the first and second active region 125a and 110a, may be defined as a ground select gate insulation layer. The gate insulation layer 135, inserted between the peripheral gate electrode 140c and the peripheral active region, may be defined as the peripheral gate insulation layer 135c.

A first impurity diffusion layer 170a may be formed at the first active region 125a of both sides of the cell gate line 165a, and a second impurity diffusion layer 170b may be formed at the second active region 10a of both sides of the cell gate line 165a. First and second common drain regions 172a and 172b may be formed at the first and second active regions 125a and 110a in one side of the string select gate line 140a, respectively. The first and second common source regions 174a and 174b may be formed on the first and second active regions 125a and 110a in one side of the ground select gate line 140b, respectively. The first and second impurity diffusions 170a and 170b, the first and second common drain regions 172a and 172b and the first and second common source regions 174a and 174b may be simultaneously formed. The peripheral impurity diffusion layer 176 may be formed at the peripheral active region of both sides of the peripheral gate electrode 140c.

A first interlayer insulation layer 180 may be formed to cover an entire surface of the semiconductor substrate 100. The first interlayer insulation layer 180 may include a bottom insulation layer and a top insulation layer, which are sequentially stacked. The bottom insulation layer may be formed, and then a body contact 250, which is connected to one end of the semiconductor pattern 110a, may be formed in the bottom insulation layer, and then the top insulation layer may be formed.

When the body contact 250 is formed in a line shape, the top insulation layer may be formed right after forming the body contact 250. When the body contact 250 is formed in a contact plug shape, the body contact 250 may be formed, and then a body interconnection, which is connected to the body contact 250, may be formed on the bottom insulation layer, and then the top insulation layer may be formed. A source line may be further formed in the bottom insulation layer. The source line may be connected to the common source regions 174a and 174b. The source line and the body contact 250 may be simultaneously formed.

The first interlayer insulation layer 180 may be patterned to form a first contact hole 185 exposing the first common drain region 172a. A first insulation spacer 190 may be formed on an inner sidewall of the first contact hole 185. A first contact plug 195 filling the first contact hole 185 may be formed. A first bit line 200 may be formed on the first interlayer insulation layer 180. The first bit line 200 may be connected to the first contact plug 195 and above the cell gate line 165a and the select gate lines 140a and 140b. When the forming of the first contact plug 195 is omitted, a portion of the first bit line 200 may be extended down to fill the first contact hole 185.

Figure 12A:
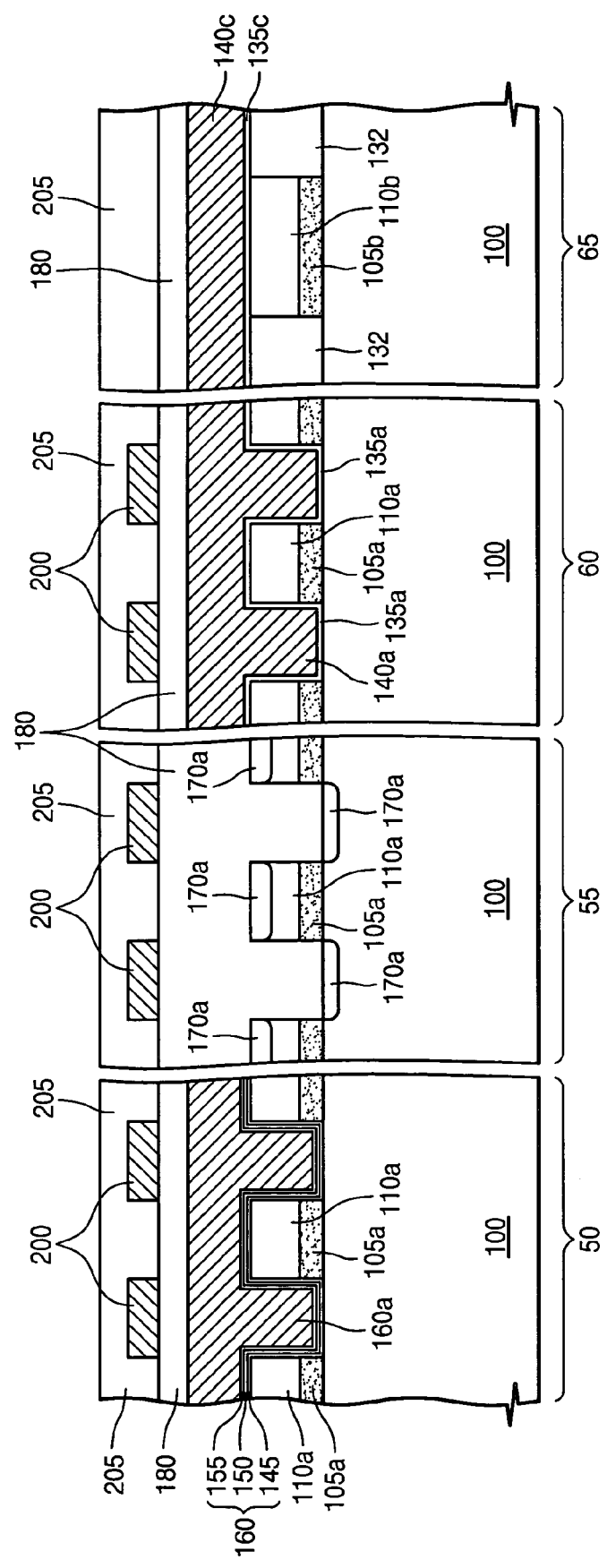
Figure 12B:
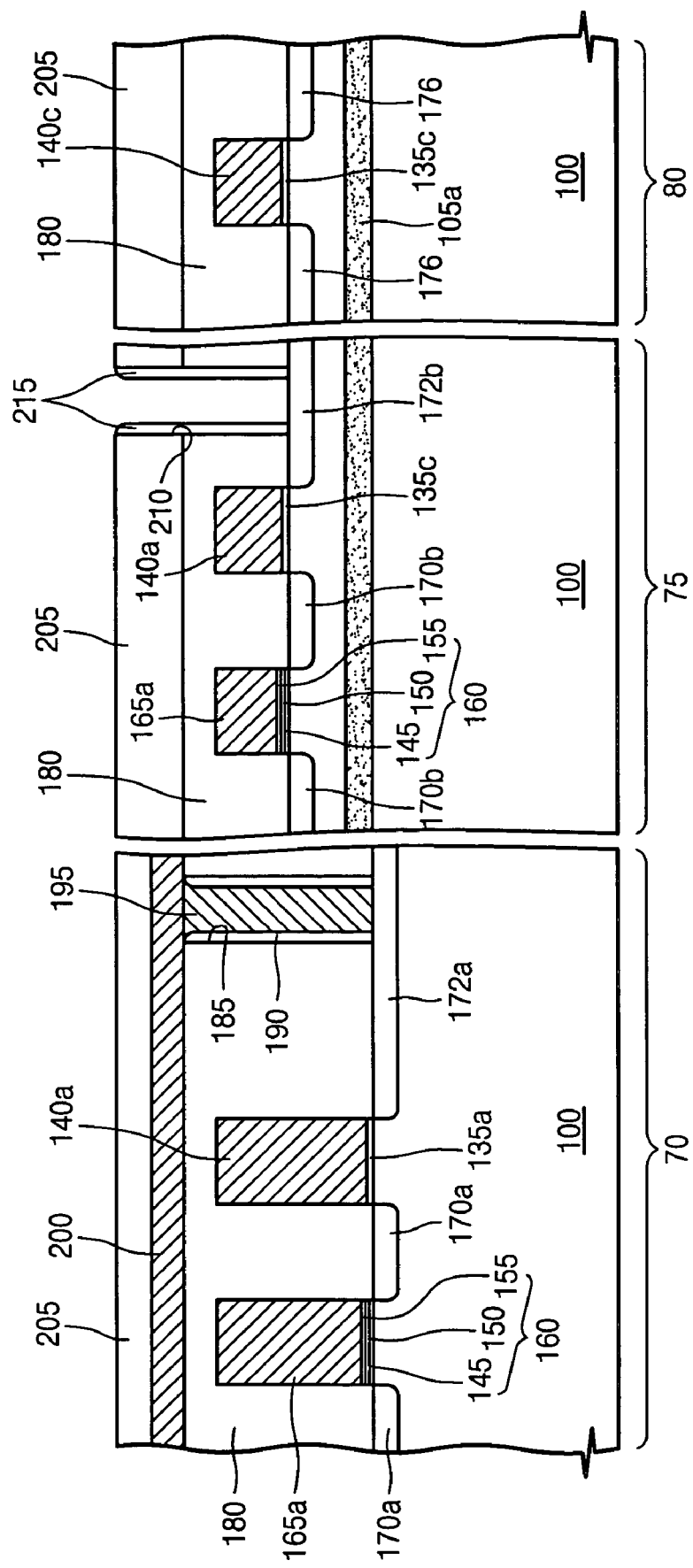

Referring to FIGS. 1, 12A, and 12B, a second interlayer insulation layer 205 covering the first bit line 200 may be formed on an entire surface of the semiconductor substrate 100. The second and first interlayer insulation layers 205 and 180 may be continuously patterned to form a second contact hole 210 exposing the second common drain region 172b. A second insulation spacer 215 may be formed on an inner sidewall of the second contact hole 210. The second contact plug 220 and the second bit line 225 of FIGS. 1 to 3 may be formed. The second contact plug 220 may be omitted. The second bit line 225 may fill the second hole 210. The non-volatile memory device of FIGS. 1 to 3 may be embodied. On the other hand, a method of forming the non-volatile memory device in FIG. 4 will be described. This method may be similar to the above method. Characteristics of this method will be described with reference to FIGS. 13 and 14.

Figure 13:
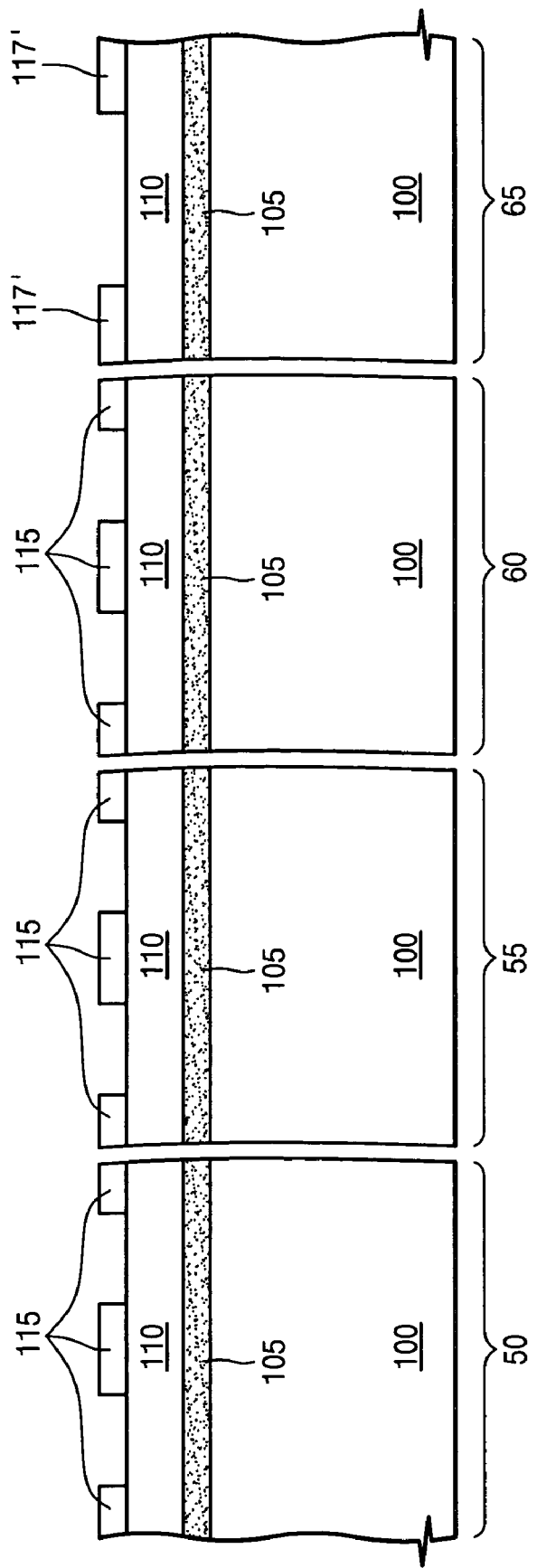
Figure 14:
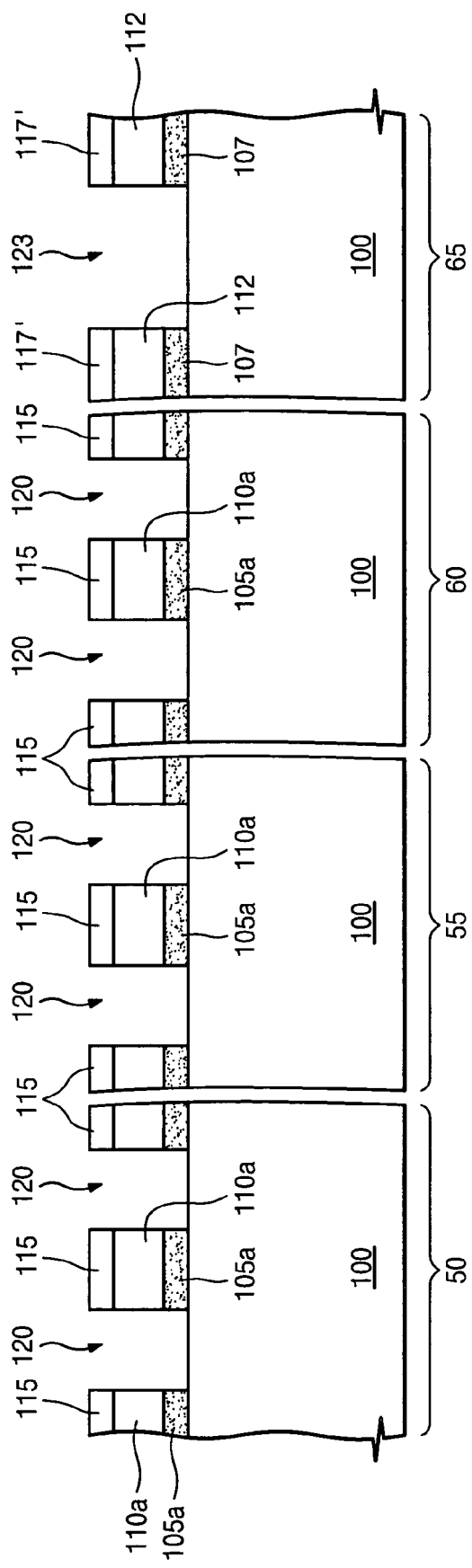

FIGS. 13 and 14 are diagrams of lines I-I', II-II', III-III' and IV-IV' of FIG. 1 to illustrate a method of forming a modified non-volatile memory device according to example embodiments. Referring to FIG. 13, a cell hard mask pattern 115 and a peripheral hard mask pattern 117' may be formed on the semiconductor layer 110. The peripheral hard mask pattern 117' may not cover a peripheral active region and may cover a region isolating a device.

Referring to FIG. 14, the semiconductor layer 110 and the buried insulation layer 105 may be continuously etched to form a cell trench 120 and a peripheral trench 123 using the hard mask patterns 115 and 117' as an etching mask. The cell trench 120 may expose the semiconductor substrate 100 of the cell string region a, and the peripheral trench 123 may expose the semiconductor substrate 100 of the peripheral region b. A peripheral isolation pattern 107 and a peripheral semiconductor pattern 112, which are sequentially stacked, may be formed below the peripheral hard mask pattern 117'. The semiconductor substrate 100, exposed by the peripheral trench 123, may correspond to the peripheral active region. The peripheral isolation pattern 107 may serve to define the peripheral active region. The hard mask patterns 115 and 117' may be removed using a wet etching process and/or any other suitable process. Processes may be performed identical to the above description with reference to FIGS. 9 to 12b.

Figure 19:
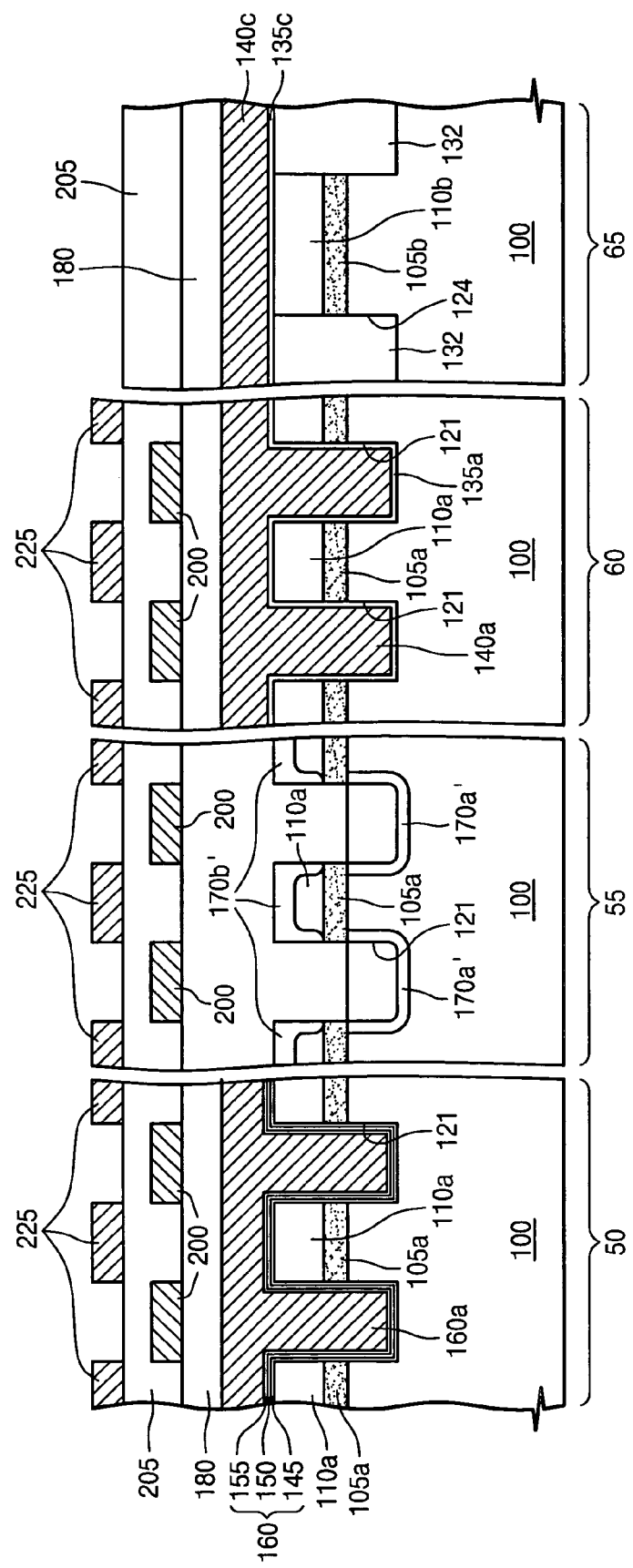
Figure 20:
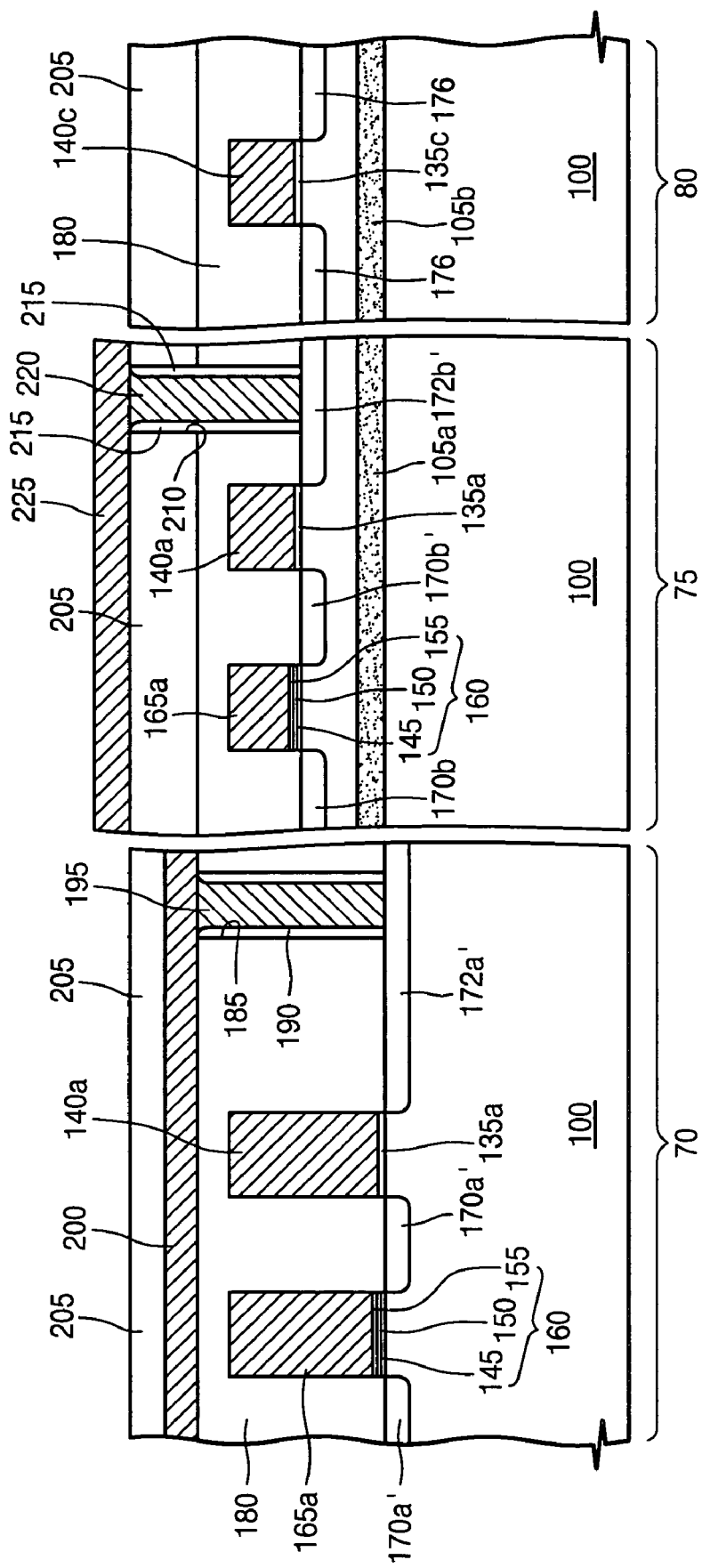

According to example embodiments, there may be provided a non-volatile memory device increasing an amount of a turn-on current of a cell and/or transistor in a limited area. Like reference numerals in the drawings denote like elements. FIG. 19 is a diagram of lines I-I', II-II', III-III' and IV-IV' of FIG. 1 to illustrate a non-volatile memory device according to other example embodiments. FIG. 20 is a diagram of lines V-V', VI-VI' and VII-VII' of FIG. 1 to illustrate a non-volatile memory device according to other example embodiments.

Referring to FIGS. 1, 19, and 20, a groove 121 may be disposed at a first active region 125a beside a cell isolation pattern 105a. The groove 121 may be parallel to a semiconductor pattern 110a that is a second active region 110a. The groove 121 may have a bottom surface lower than a top surface of the semiconductor substrate 100. The bottom surface of the groove 121 may be lower than a bottom surface of the cell isolation pattern 105a. The groove 121 may have both inner sidewalls.

A cell gate line 165a may be on the first active region 125a and the second active region 110a. The cell gate line 165a may be formed on both inner sidewalls and the bottom surface of the groove 121, and the cell gate line 165a may be formed on both sidewalls and a top surface of the semiconductor pattern 110a. A multi-layered trap insulation layer 160 may be inserted between the cell gate line 165a and the groove 121. The multi-layered trap insulation layer 160 may be inserted between the cell gate line 165a and the semiconductor pattern 110a.

A first channel region of the first non-volatile memory cell formed at the first active region 125a may be defined through both inner sidewalls and the bottom surface of the groove 121 below the cell gate line 165a. A second channel region of the first non-volatile memory cell formed at the second active region 110a may be defined through both sidewalls and the top surface of the semiconductor pattern 110a below the cell gate line 165a. The first and second channel regions may have a broader channel width in a limited area.

A first impurity diffusion layer 170a' may be formed at the first active region 125a of both sides of the cell gate line 165a, and a second impurity diffusion layer 170b' may be formed at the second active region 110a of both sides of the cell gate line 165a. The first impurity diffusion layer 170a' may be formed below both inner sidewalls and bottom of the groove 121 located at both sides of the cell gate line 165a. The first impurity diffusion layer 170a' may correspond to the first channel region having the increased channel width. The second impurity diffusion layer 170b' may be formed below both sidewalls and top surface of the semiconductor pattern 110a located at both sides of the cell gate line 165a. The second impurity diffusion layer 170b' may correspond to the second channel region having the increased channel width.

At least a portion of the bottom surface of the second impurity diffusion layer 170b' may be spaced apart from the cell isolation pattern 105a. A body contact 250 may be electrically connected to a body region below the second channel region via the semiconductor pattern 110a between the second impurity diffusion layer 170b' and the cell isolation pattern 105a. String and ground select gate lines 140a and 140b may be formed on both inner sidewalls and the bottom surface of the groove 121 there below. The string and ground select gate lines 140a and 140b may be formed on both sidewalls and the top surface of the semiconductor pattern 110a therebelow. The channel regions of string and ground select transistors may have an increased channel width in a limited area.

First and second common drain regions 172a' and 172b' may be formed at the first and second active regions 125a and 110a located at one side of the string select gate line 140a, respectively. The first and second common drain regions 172a' and 172b' may be similar to the first and second impurity diffusion layers 170a' and 170b'. The first common drain region 172a' may be formed below both inner sidewalls and the bottom surface of the groove 121 located at one side of the string select gate line 140a and the second common drain region 172b' may be formed below both sidewalls and the top surface of the semiconductor pattern 110a located at one side of the string select gate line 140a. The first and second common drain regions 172a' and 172b' may correspond to an increased channel width of the string select transistors.

A peripheral device isolation layer 132 of the peripheral region b may fill a peripheral trench 122' to surround the sidewalls of a peripheral active region pattern 110b and a buried insulation pattern 105b. The bottom surface of the peripheral trench 122' may be lower than the top surface of the semiconductor substrate 100. The bottom surface of the peripheral trench 122' may have a height identical to that of the bottom surface of the groove 121. The memory cells of the above non-volatile memory device may have an increased channel width in a limited area because of the semiconductor pattern 110 and the groove 121. An amount of turn-on current in the memory cells may increase, and also, characteristics (e.g., a sensing margin increase) of the non-volatile memory device may be improved. On the other hand, the peripheral transistor of the peripheral region b may be embodied in another form. This will be described with reference to FIG. 21.

Figure 21:
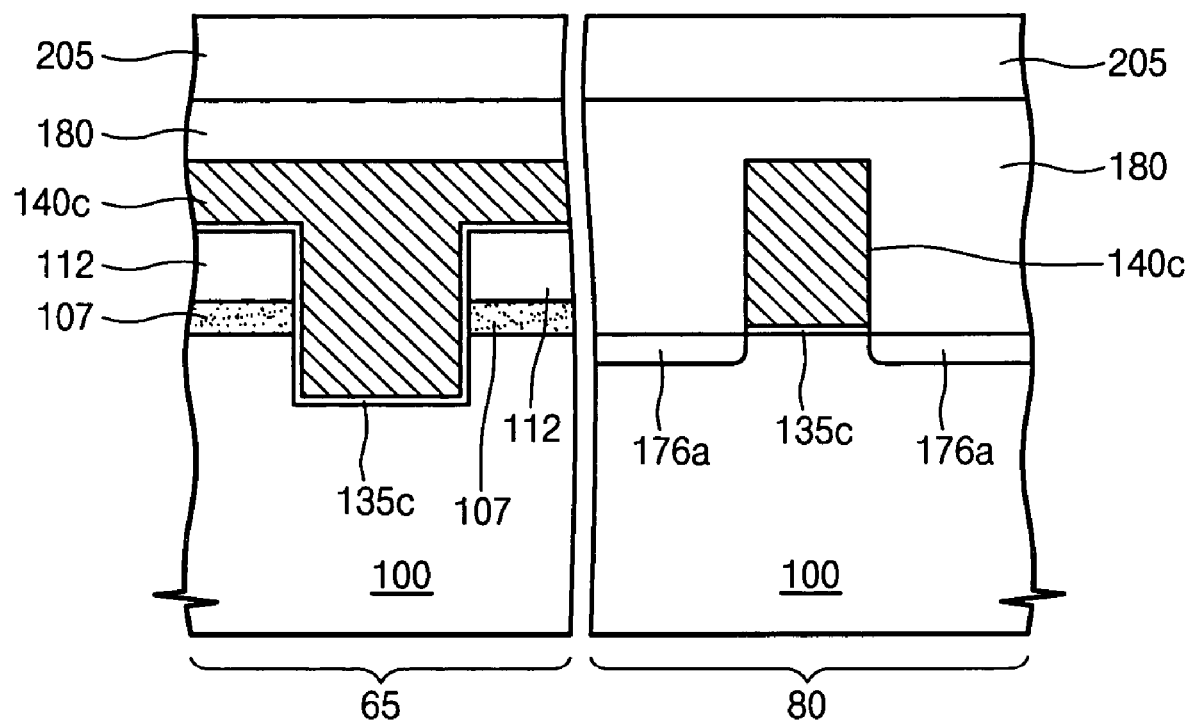

FIG. 21 is a diagram of lines IV-IV' and VII-VII' of FIG. 1 to illustrate a modified non-volatile memory device according to other example embodiments. Referring to FIGS. 1 and 21, a peripheral isolation pattern 107 defining a peripheral active region may be disposed on the semiconductor substrate 100 of the peripheral region b, and a peripheral semiconductor pattern 112 may be disposed on the peripheral isolation pattern 107. The peripheral active region may be a portion of the semiconductor substrate 100. A peripheral groove 124 may be disposed at the peripheral active region. The peripheral groove 124 may have a bottom surface lower than the top surface of the semiconductor substrate 100, and also, the peripheral groove 124 may have both inner sidewalls.

A peripheral gate electrode 140c may be formed on the top surface of the peripheral active region. A peripheral gate insulation layer 135a may be inserted between the peripheral gate electrode 140c and the peripheral active region. The peripheral gate electrode 140c may be formed on both inner sidewalls and the bottom surface of the peripheral groove 124 therebelow. The width of the channel region of a peripheral transistor having the peripheral gate electrode 140c may increase in a limited area.

A peripheral impurity diffusion layer 176a may be disposed at the peripheral active region located at both sides of the peripheral gate electrode 140c. The peripheral impurity diffusion layer 176a may be formed below both inner sidewalls and the bottom surface of the peripheral groove 124 located at both sides of the peripheral gate electrode 140c, thus the peripheral impurity diffusion layer 176a may correspond to an increased channel width of the channel region in the peripheral transistor. On the other hand, the non-volatile memory device may include the peripheral transistor of FIG. 21. After holes 120 and 123 of FIG. 14 are formed, the semiconductor substrate 100 exposed to the peripheral hole 123 may be etched using a photosensitive film covering the cell holes 120 to form the peripheral groove 124 of FIG. 21.

Figure 27:
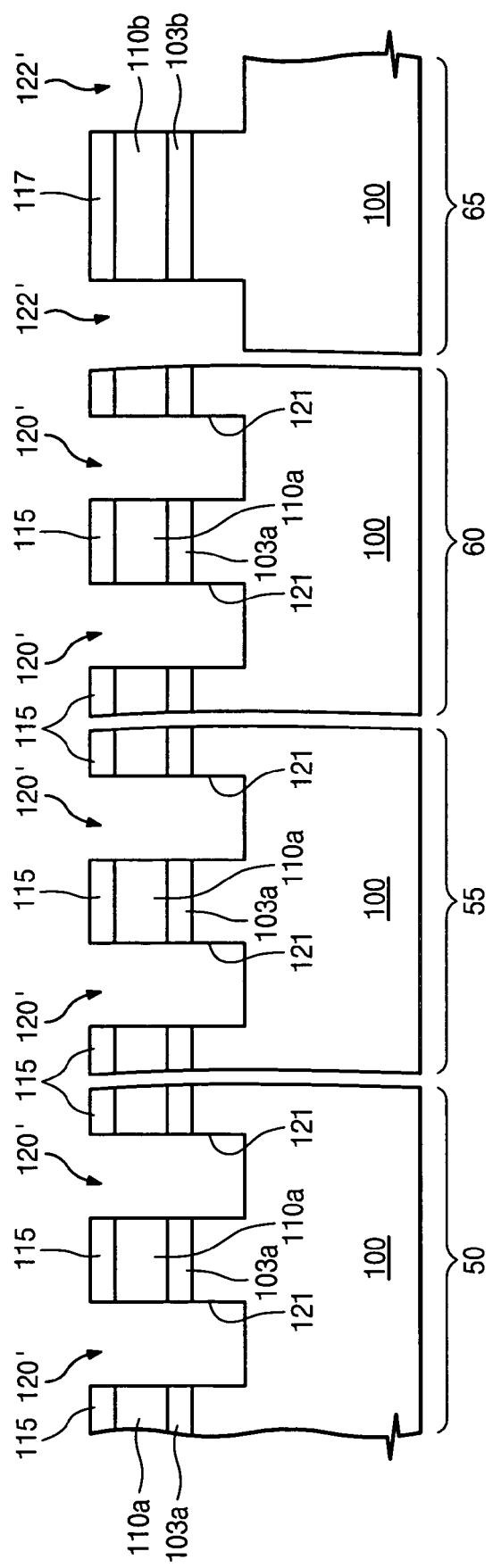
Figure 28:
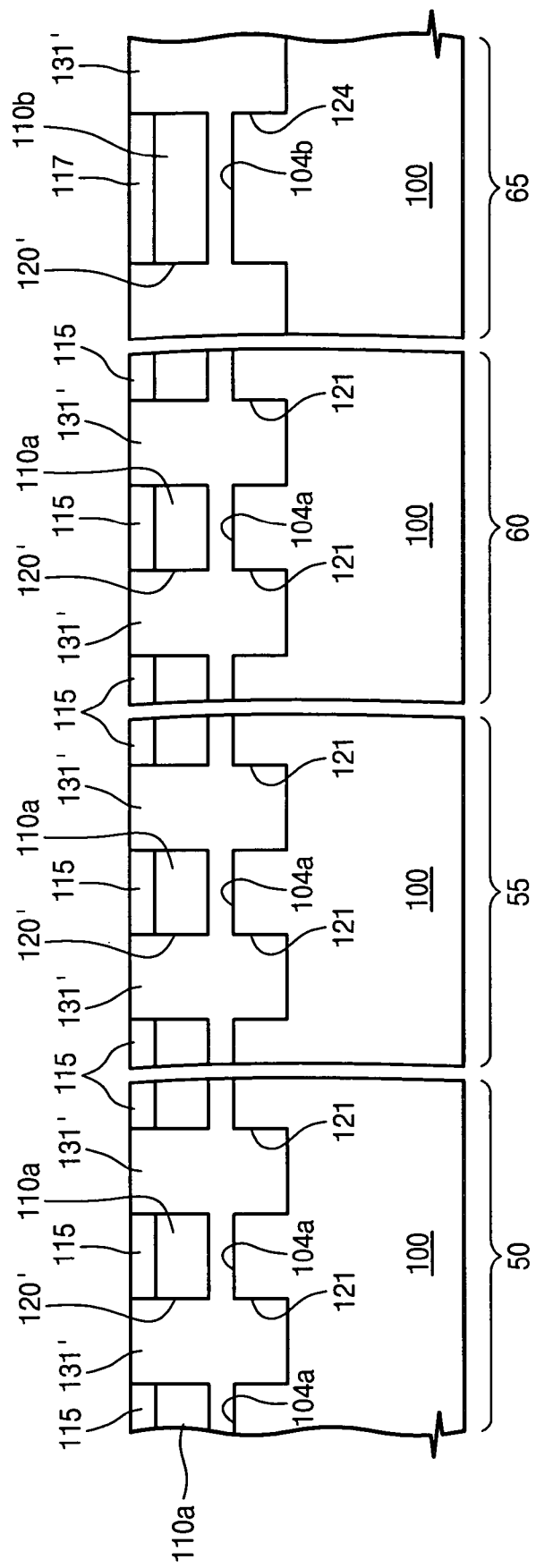

A method of forming the non-volatile memory device will be described with reference to FIGS. 22 to 25. This method may be performed identical to the forming method of FIG. 5. FIGS. 22 to 25 are diagrams of lines I-I', II-II', III-III' and IV-IV' of FIG. 1 to illustrate a method of forming a non-volatile memory device according to other example embodiments. FIGS. 27 and 28 are diagrams of lines I-I', II-II', III-III' and IV-IV' of FIG. 1 to illustrate another method of forming active regions and a cell isolation pattern according to other example embodiments.

Figure 22:
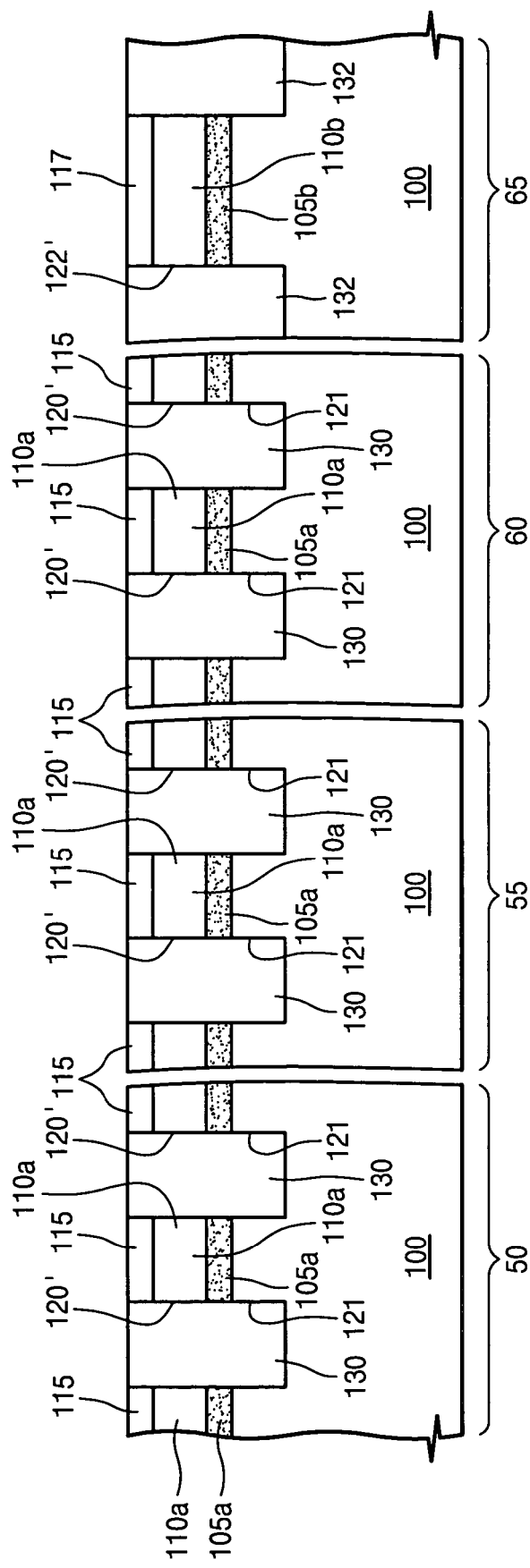

Referring to FIGS. 1, 5, and 22, the semiconductor pattern 110, the buried insulation layer 105 and the semiconductor substrate 100 may be continuously patterned using the cell and peripheral hard mask patterns 115 and 117 as an etching mask to form a cell trench 120' of the cell string region a and a peripheral trench 122' of the peripheral region b. The cell isolation pattern 105a and the semiconductor pattern 110a, which are sequentially stacked, may be formed below the cell hard mask pattern 115. The buried insulation pattern 105b and the peripheral active semiconductor pattern 110b, which are sequentially stacked, may be formed below the peripheral hard mask pattern 117. The lower portion of the cell trench 120' below the cell isolation pattern 105a may correspond to the groove 121 of FIG. 19.

An insulation layer 130 filling the cell trench 120' and the peripheral trench 122' may be formed on an entire surface of the semiconductor substrate 100. The insulation layer 130 may be planarized until the hard mask patterns 115 and 117 are exposed. The planarized insulation layer 130 filling the peripheral trench 122' may correspond to the peripheral device isolation layer 122.

Figure 23:
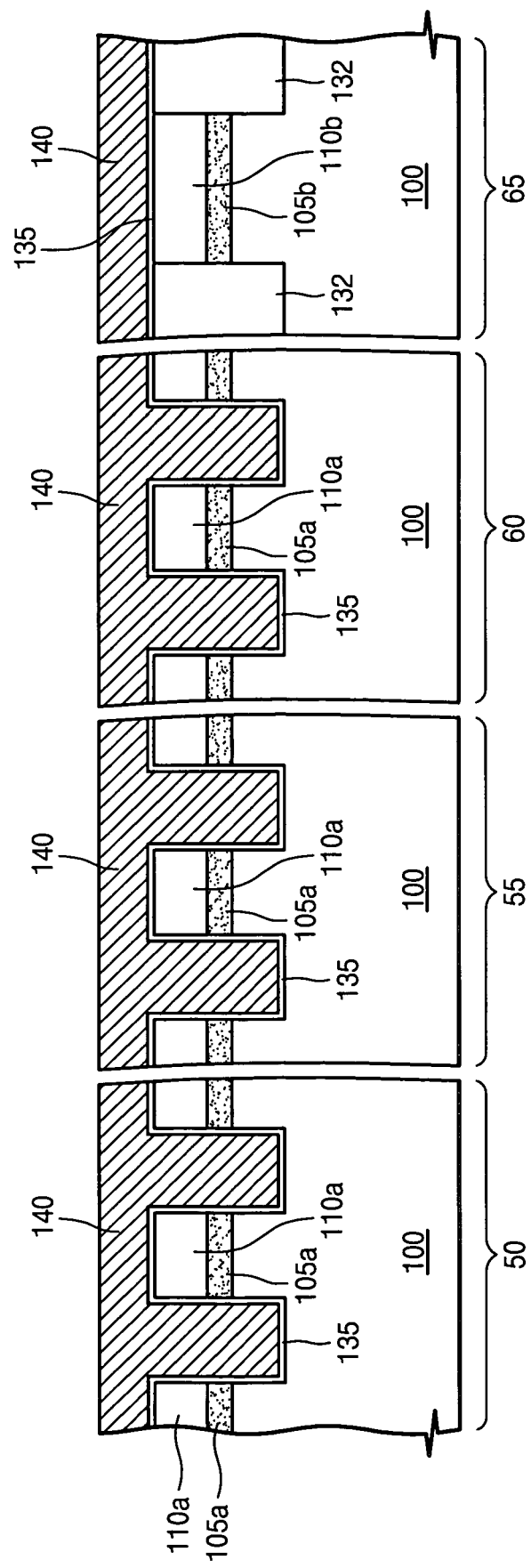

Referring to FIG. 23, the planarized insulation layer 130 in the cell trench 120' may be removed to expose both inner sidewalls and the bottom surface of the groove 121, and both sidewalls of the semiconductor pattern 110a. The hard mask patterns 115 and 117 may be removed to expose the top surfaces of the semiconductor pattern 110a and the peripheral active semiconductor pattern 110b. Before the forming of the insulation layer 130 and/or after the planarized insulation layer 130 in the cell trench 120' is removed, the surface treatment process may be performed. A gate insulation layer 135 may be formed on the semiconductor substrate 100, and then a first gate conductive layer 140 filling the cell trench 120' may be formed on the gate insulation layer 135.

On the other hand, the cell isolation pattern 105a, and the first and second active regions 125a and 110a may be formed using another method. This method is similar to the method in description with reference to FIG. 18. Characteristics of this method will be described with reference to the drawings. Referring to FIG. 27, a sacrificial layer 103 and a semiconductor layer 110 may be sequentially formed on the semiconductor substrate 100, and then hard mask patterns 115 and 117 may be formed on the semiconductor layer 110. Using the hard mask patterns 115 and 117 as a mask, the semiconductor layer 110, the sacrificial layer 105 and the semiconductor substrate 100 may be continuously patterned to form the cell trench 120' and the peripheral trench 122'. The sidewalls of the cell and peripheral sacrificial patterns 103a and 103b may be exposed by the trench 120' and 122'. A portion of the cell trench 120' in the semiconductor substrate 100 may correspond to the groove 121.

Referring to FIG. 28, the exposed sacrificial patterns 103a and 103b may be removed to form first and second empty regions 104a and 104b. An insulation layer 131' filling the first and second empty regions 104a and 104b, and the trench 120' and 122' may be formed, and then the insulation layer 131' may be planarized until the hard mask pattern 115 and 117 are exposed. The planarized insulation layer 131' in the cell trench 120' may be removed by an anisotropic etching process to expose both inner sidewalls and the bottom surface of the groove 121, and both sidewalls of the semiconductor pattern 110a.

Figure 24:
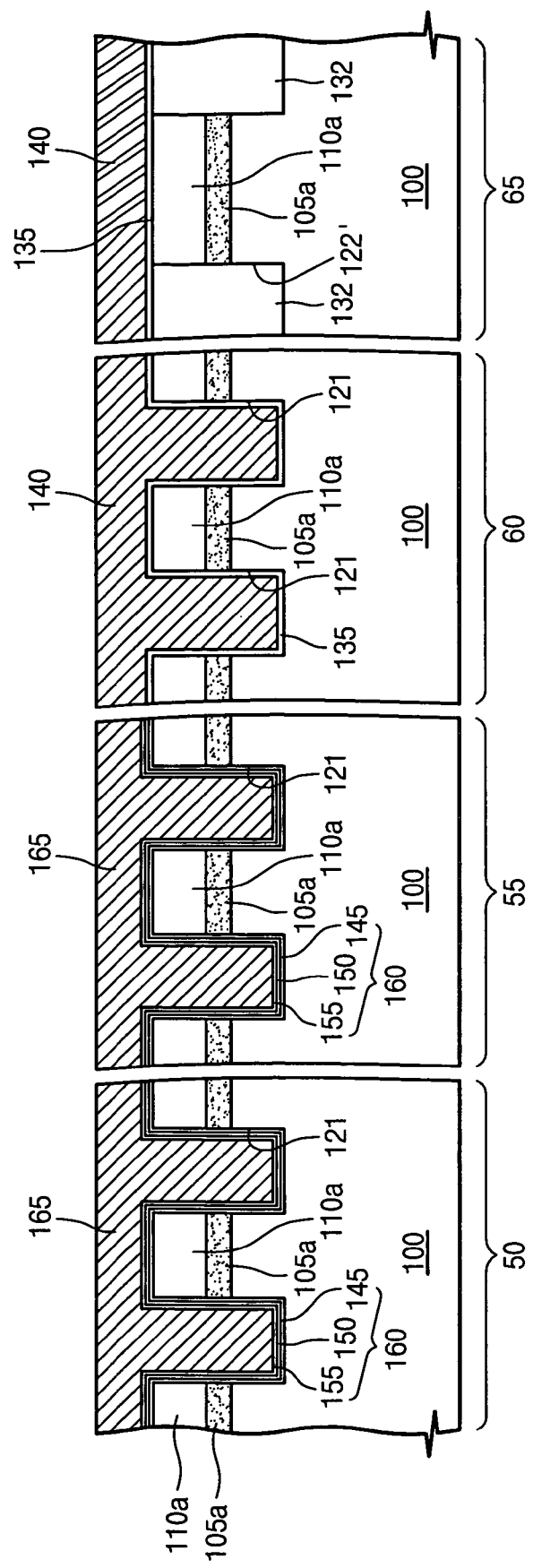

The insulation layer 131' in the first empty region 104a may correspond to the cell isolation pattern 105a of FIG. 23. The insulation layer 131' in the second empty region 104b may correspond to the buried insulation pattern 105b of FIG. 23. The insulation layer 131' in the peripheral trench 122' may correspond to the peripheral device isolation layer 132 of FIG. 23. Referring to FIG. 24, the first gate conductive layer 140 and the gate insulation layer 135 in a region, where non-volatile memory cells are formed, may be removed. The gate insulation layer 135 and the first gate conductive layer 140 of the peripheral region b and of a region, where the select transistors are formed, may remain. A multi-layered insulation layer 160 and the second gate conductive layer 165 may be sequentially formed on the semiconductor substrate 100. The second gate conductive layer 165 may fill the cell trench 122'. The second gate conductive layer 165 and the multi-layered tunnel insulation layer 160 in the region, where the select transistors are formed, and the peripheral region b, may be removed.

Figure 25:
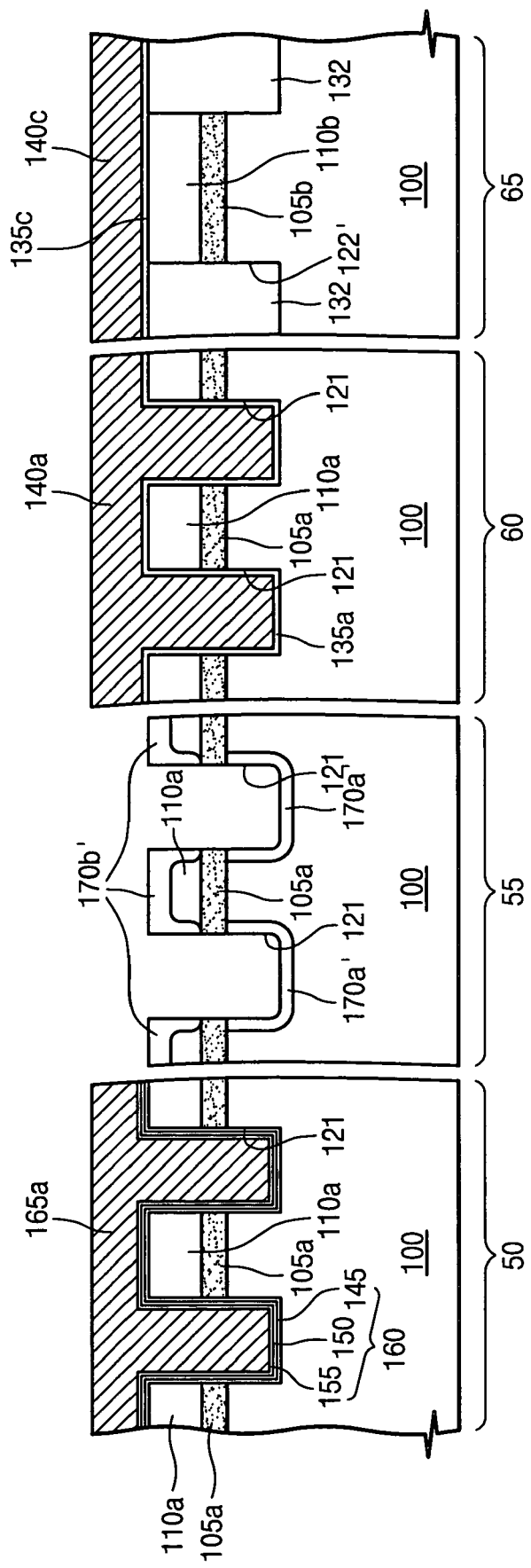

Referring to FIGS. 1, 20, and 25, the first gate conductive layer 140 may be patterned to form the select gate lines 140a and 140b, and the peripheral gate electrode 140c. The second gate conductive layer 165 may be patterned to form the cell gate line 165a. Using the gate lines 165a, 140a, and 140b as a mask, impurity ions may be injected to form the first and second impurity diffusion layers 170a', and 170b', the first and second common drain regions 172a' and 172b', and the first and second common source regions 174a and 174b. The injecting of the impurity ions may include injecting the impurity ions to tilt at the top surface of the semiconductor substrate. The injecting of the impurity ions may include perpendicularly injecting the impurity ions at the top surface of the semiconductor substrate 100, and injecting the impurity ions to tilt at the top surface of the semiconductor substrate 100. The diffusion layers 170a and 170b', and regions 172a', 172b', 174a, and 174b described with reference to FIGS. 19 and 20 may be embodied.

The impurity ions may be injected at the peripheral active region of both sides of the peripheral gate electrode 140c to form the peripheral impurity diffusion layer 176a. The next processes may be performed identical to the method described with reference to FIGS. 11a, 11b, 12a, and 12b. On the other hand, a method of forming a non-volatile memory device of FIG. 21 may be described with reference to drawings.

Figure 26:
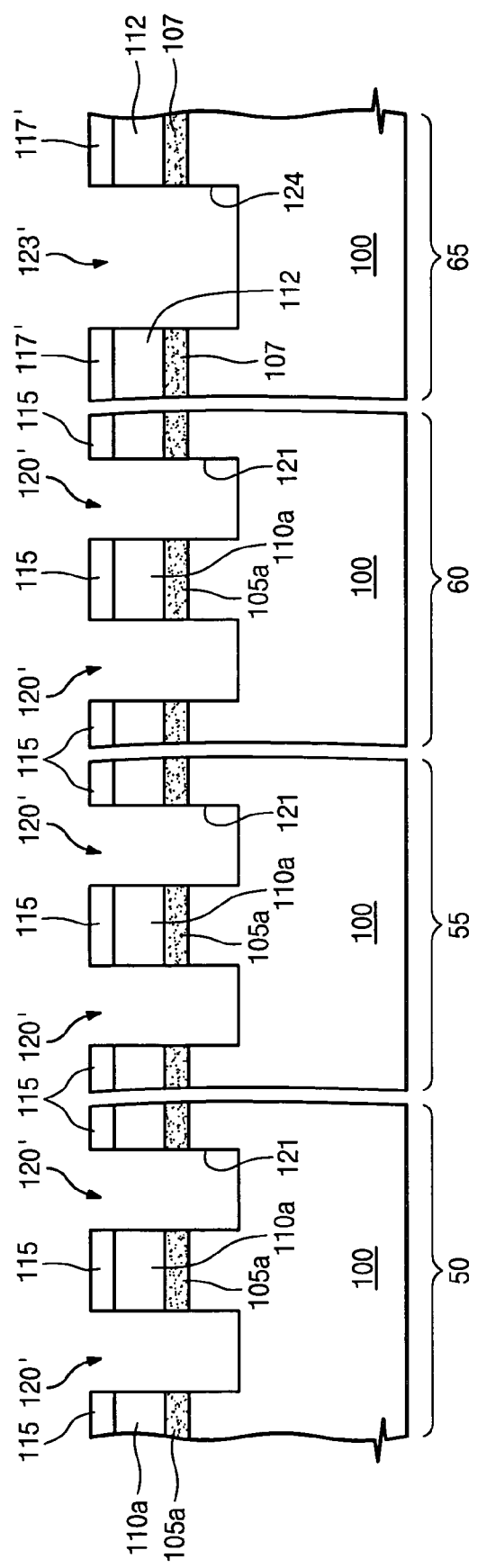

FIG. 26 is a diagram of lines I-I', II-II', III-III' and IV-IV' of FIG. 1 to illustrate a method of forming a modified non-volatile memory device according to other example embodiments. Referring to FIG. 26, using the hard mask patterns 115 and 117 on the semiconductor layer 110 as a mask, the semiconductor layer 110, the buried insulation layer 105, and the semiconductor substrate 100 may be continuously patterned to form the cell trench 120' and the peripheral trench 123'. The semiconductor substrate 100 exposed to the peripheral trench 123' may correspond to the peripheral active region. A lower portion of the peripheral trench 123' below the semiconductor substrate 100 may correspond to the peripheral groove 124. The process of forming the gate insulation layer 135, and the subsequent processes may be performed identical to the method described with reference to FIGS. 23 to 25.

According to this method, the forming of the insulation layer filling the trenches 120' and 122', and the removing of the insulation layer of the cell trench 120' may be omitted. The processes may be simplified and the etching damage in the surface of the groove 121 may be minimized or reduced. Characteristics of the non-volatile memory cell may be improved. As described above, a cell isolation pattern may electrically isolate a first active region therebeside from a second active region thereabove. An interval between a non-volatile memory cell formed at the first active region and a non-volatile memory cell formed at the second active region may be reduced or minimized. The interval between the non-volatile memory cells of the first and second active regions may be zero. The non-volatile memory device may be highly integrated.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific embodiments disclosed and that modifications to the disclosed example embodiments, as well as other example embodiments, are intended to be included within the scope of the appended claims. Example embodiments are defined by the following claims, with equivalents of the claims to be included therein.

What is claimed is:

1. A non-volatile memory device comprising:
   a cell isolation pattern a semiconductor patter on a top surface of the cell isolation pattern on a region of a semiconductor substrate;
   a cell gate line on the semiconductor pattern and on a top surface of the semiconductor substrate on one side of the cell isolation pattern;
   a multi-layered trap insulation layer between the cell gate line and the semiconductor substrate, and the cell gate line and the semiconductor pattern;
   a first impurity diffusion layer in the semiconductor substrate on both sides of the cell gate line; and
   a second impurity diffusion layer in the semiconductor pattern on both sides of the cell gate line.

2. The non-volatile memory device of claim 1, wherein the semiconductor substrate includes a groove parallel to the semiconductor pattern on one side of the cell isolation pattern and has a bottom surface lower than the top surface of the semiconductor substrate, and
   the cell gate line on the top surface, both sidewalls of the semiconductor pattern and the bottom surface and both inner sidewalls of the groove.

3. The non-volatile memory device of claim 2, wherein the first impurity diffusion layer is below both inner sidewalls and the bottom surface of the groove of both sides of the cell gate line, and the second impurity diffusion layer is below the top surface and both sidewalls of the semiconductor pattern of both sides of the cell gate line.

4. The non-volatile memory device of claim 1, wherein at least a portion of the bottom surface of the second impurity diffusion layer is spaced apart from the top surface of the cell isolation pattern.

5. The non-volatile memory device of claim 4, further comprising:
   a body contact contacting one end of the semiconductor pattern,
   wherein the body contact is electrically connected to the semiconductor pattern below the cell gate line via the semiconductor pattern between the second impurity diffusion layer and the cell isolation pattern.

6. The non-volatile memory device of claim 1, wherein the multi-layered trap insulation layer includes a tunnel insulation layer, a trap storage layer, and a blocking insulation layer.

7. The non-volatile memory device of claim 1, further comprising:
- a select gate line spaced laterally from and parallel to the cell gate line, and on the semiconductor pattern and the semiconductor substrate on one side of the cell isolation pattern;
- a select gate insulation layer between the select gate line and the semiconductor pattern, and the select gate line and the semiconductor substrate;
- a first common drain region in the semiconductor substrate and on one side of the select gate line; and
- a second common drain region in the semiconductor pattern and on one side of the select gate line,
- wherein the select gate line is between the cell gate line and the first common drain region and between the cell gate line and the second common drain region.

8. The non-volatile memory device of claim 7, further comprising:
- a first interlayer insulation layer covering an entire surface of the semiconductor substrate;
- a first bit line on the first interlayer insulation layer, and connected to the first common drain region via a first contact hole through the first interlayer insulation layer;
- a second interlayer insulation layer covering the entire surface of the semiconductor substrate; and
- a second bit line on the second interlayer insulation layer and connected to the second common drain region via a second contact hole through the first and second interlayer insulation layers,
- wherein the first and second bit lines are above and parallel to the cell and select gate lines, the first bit line above the semiconductor substrate, and the second bit line above the semiconductor pattern.

9. The non-volatile memory device of claim 8, further comprising:
- a first insulation spacer on an inner sidewall of the first contact hole; and
- a second insulation spacer on an inner sidewall of the second contact hole,
- wherein the first contact hole and the second contact hole are on respectively different rows.

10. The non-volatile memory device of claim 1, wherein the semiconductor substrate further includes a peripheral region on which a peripheral circuit is disposed, the peripheral circuit including:
- a peripheral gate electrode above a peripheral active region defined in the peripheral region;
- a peripheral gate insulation layer between the peripheral gate electrode and the peripheral active region; and
- a peripheral impurity diffusion layer in the peripheral active region of both sides of the peripheral gate electrode.

11. The non-volatile memory device of claim 10, wherein the peripheral active region is a protruding part extending upward from the top surface of the semiconductor substrate of the peripheral region.

12. The non-volatile memory device of claim 11, further comprising:
- a peripheral device isolation layer on both sidewalls of the peripheral active region, wherein a top surface of the peripheral active region has a height identical to that of the semiconductor pattern.

13. The non-volatile memory device of claim 10, further comprising:
- a buried insulation pattern and a peripheral semiconductor pattern on the semiconductor substrate of the peripheral region; and
- a peripheral device isolation layer on both sidewalls of the buried insulation pattern and the peripheral semiconductor pattern,
- wherein the peripheral active region is the peripheral semiconductor pattern.

14. The non-volatile memory device of claim 10, further comprising:
- a peripheral isolation pattern on the semiconductor substrate of the peripheral region to define the peripheral active region as a portion of the semiconductor substrate; and
- a peripheral semiconductor pattern on the peripheral isolation pattern.

15. The non-volatile memory device of claim 14, wherein the peripheral active region includes a peripheral groove that has a bottom surface lower than the top surface of the semiconductor substrate in the peripheral region;
- the peripheral gate electrode above both inner sidewalls and a bottom surface of the peripheral groove; and
- the peripheral impurity diffusion layer below both inner sidewalls and the bottom surface of the peripheral groove of both sides of the peripheral gate electrode.

* * * * *